United States Patent
Watanabe et al.

(10) Patent No.: US 6,632,723 B2
(45) Date of Patent: Oct. 14, 2003

(54) SEMICONDUCTOR DEVICE

(75) Inventors: Shinichi Watanabe, Yokohama (JP);
Takashi Ohsawa, Yokohama (JP);
Kazumasa Sunouchi, Yokohama (JP);
Yoichi Takegawa, Yokohama (JP);
Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/132,520

(22) Filed: Apr. 26, 2002

(65) Prior Publication Data

US 2002/0160581 A1 Oct. 31, 2002

(30) Foreign Application Priority Data

Apr. 26, 2001 (JP) .............................. 2001-129908
Jul. 2, 2001 (JP) .............................. 2001-201280

(51) Int. Cl.$^7$ .............................. H01L 21/76
(52) U.S. Cl. .............. 438/421; 438/156; 438/157; 438/192; 438/212; 438/206; 438/283; 257/135; 257/263; 257/302; 257/328; 257/329
(58) Field of Search .............. 438/421, 270, 438/266, 268, 156, 157, 212, 283, 110, 192, 206; 257/266, 135, 328, 329, 263, 302

(56) References Cited

U.S. PATENT DOCUMENTS

| | | | | |
|---|---|---|---|---|
| 5,382,816 A | * | 1/1995 | Mitsui | 257/266 |
| 5,480,838 A | * | 1/1996 | Mitsui | 438/270 |
| 5,689,127 A | * | 11/1997 | Chu et al. | 257/329 |
| 5,780,327 A | * | 7/1998 | Chu et al. | 438/156 |
| 6,396,108 B1 | * | 5/2002 | Krivokapic et al. | 257/365 |
| 6,506,638 B1 | * | 1/2003 | Yu | 438/156 |

FOREIGN PATENT DOCUMENTS

| | | |
|---|---|---|
| JP | 3-171768 | 7/1991 |
| JP | 2000-299373 | 10/2000 |

OTHER PUBLICATIONS

Mizuno et al., "High Performance Characterstics in Trench Dual–Gate MOSFET (TDMOS)" IEEE Trans.On Electron Devices, vol.38, No.9, Sep. 1991.*

(List continued on next page.)

Primary Examiner—Matthew Smith
Assistant Examiner—Belur V Keshavan
(74) Attorney, Agent, or Firm—Oblon, Spivak, McClelland, Maier & Neustadt, P.C.

(57) ABSTRACT

A semiconductor device is disclosed, which includes a semiconductor substrate, drain and source regions of a MOS transistor, a gate electrode formed on a surface of a channel region of the MOS transistor trench type element isolation regions in each of which an insulating film is formed on a surface of a trench formed in the surface of the semiconductor substrate, the element isolation regions sandwiching the channel region from opposite sides thereof in a channel width direction, and a conductive material layer for a back gate electrode, which is embedded in a trench of at least one of the element isolation regions, configured to be supplied with a predetermined voltage to make an depletion layer in a region of the semiconductor substrate under the channel region of the MOS transistor or to voltage-control the semiconductor substrate region.

29 Claims, 27 Drawing Sheets

OTHER PUBLICATIONS

Lim et al. "Threshold Voltage of Thin–Film Silicon–on–Insulator (SOI) MOSFET's", IEEE Trans. On Electron Devices, vol. ED 30, No 10, Oct. 1983.*

Sunouchi et al. "A surrounding Gate Transistor (SGT) Cell for 64/256 Mbit DRAMs". IEDM 89, Technical Digest, pp. 22–26.*

Hsing–jen WANN, et al., IEDM–93, pp. 635–638, "A Capacitorless DRAM Cell on SOI Substrate", 1993.

Marnix R. Tack, et al., IEEE Transactions on Electron Devices, vol. 37, No. 5, pp. 1373–1382, "The Multistable Charge–Controlled Memory Effect in SOI MOS Transistors at Low Temperatures", May 1990.

John E. Leiss, et al., IEEE Journal of Solid–State Circuits, vol. SC–17, No. 2, pp. 337–344, "dRAM Design Using the Taper–Isolated Dynamic Ram Cell", Apr. 1982.

Hon–Sum P. Wong, et al., IEDM–97, pp. 427–430, "Self–Aligned (Top and Bottom) Double–Gate MOSFET With a 25 NM Thick Silicon Channel", 1997.

John E. Leiss, et al., IEEE Transactions on Electron Devices, vol. ED–29, No. 4, pp. 707–714, "dRAM Design Using the Taper–Isolated Dynamic Ram Cell", Apr. 1982.

* cited by examiner

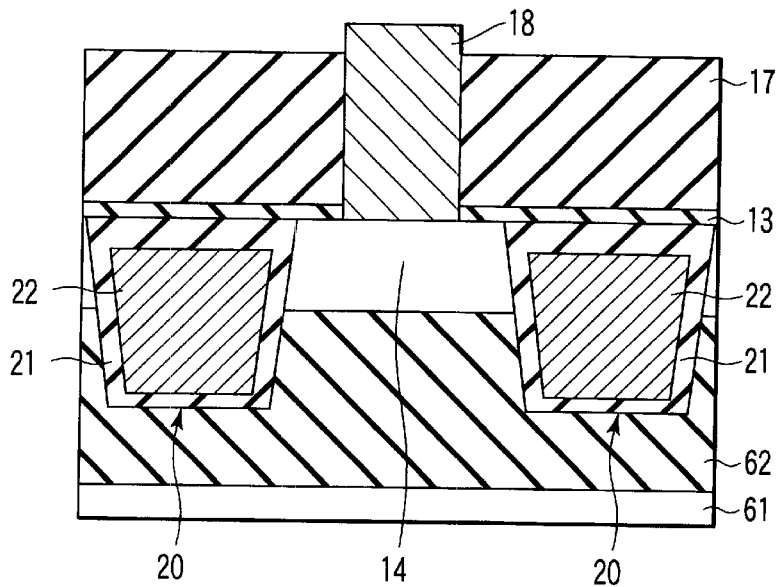
FIG. 7
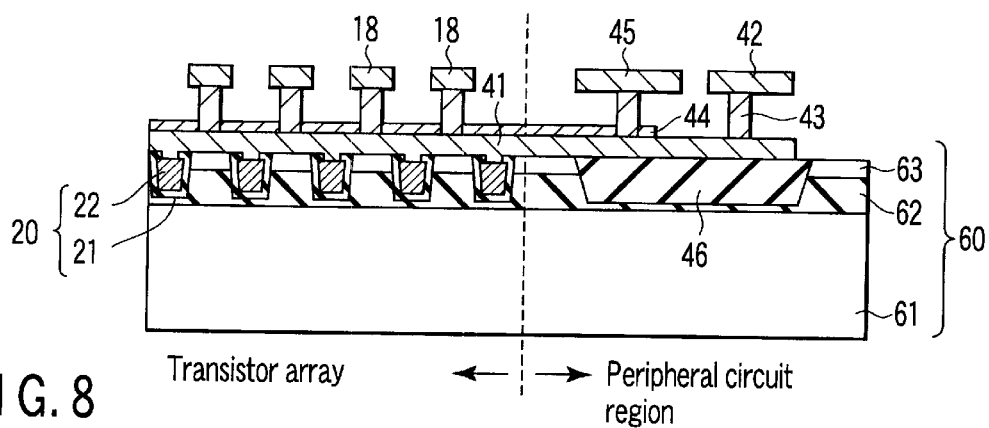
FIG. 8    Transistor array ←→ Peripheral circuit region
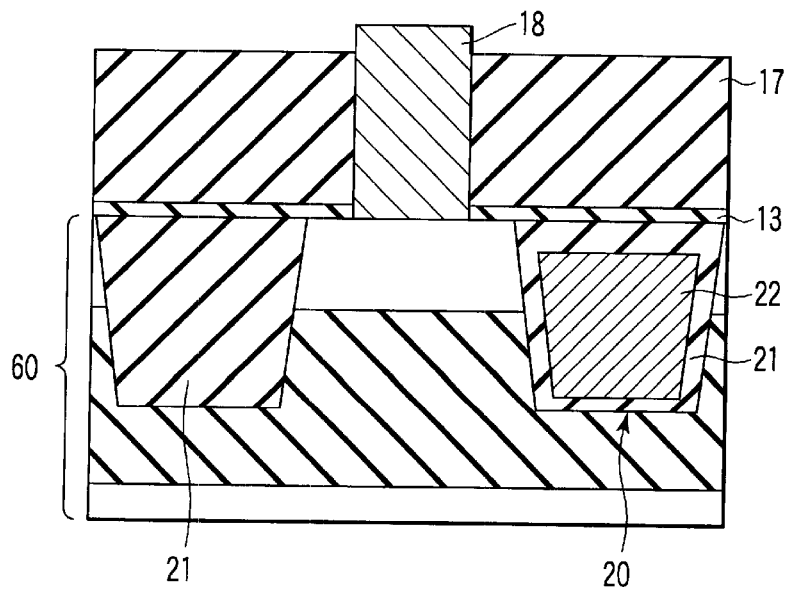
FIG. 9

Transistor array ←→ Peripheral circuit region

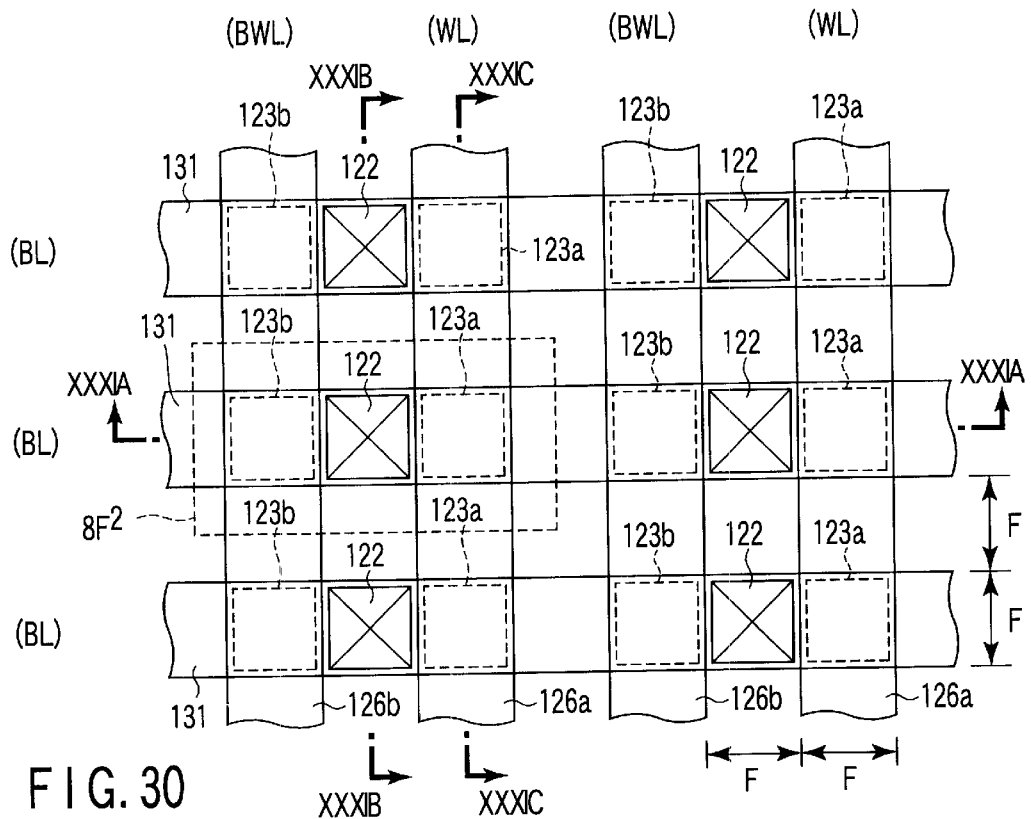
F I G. 30
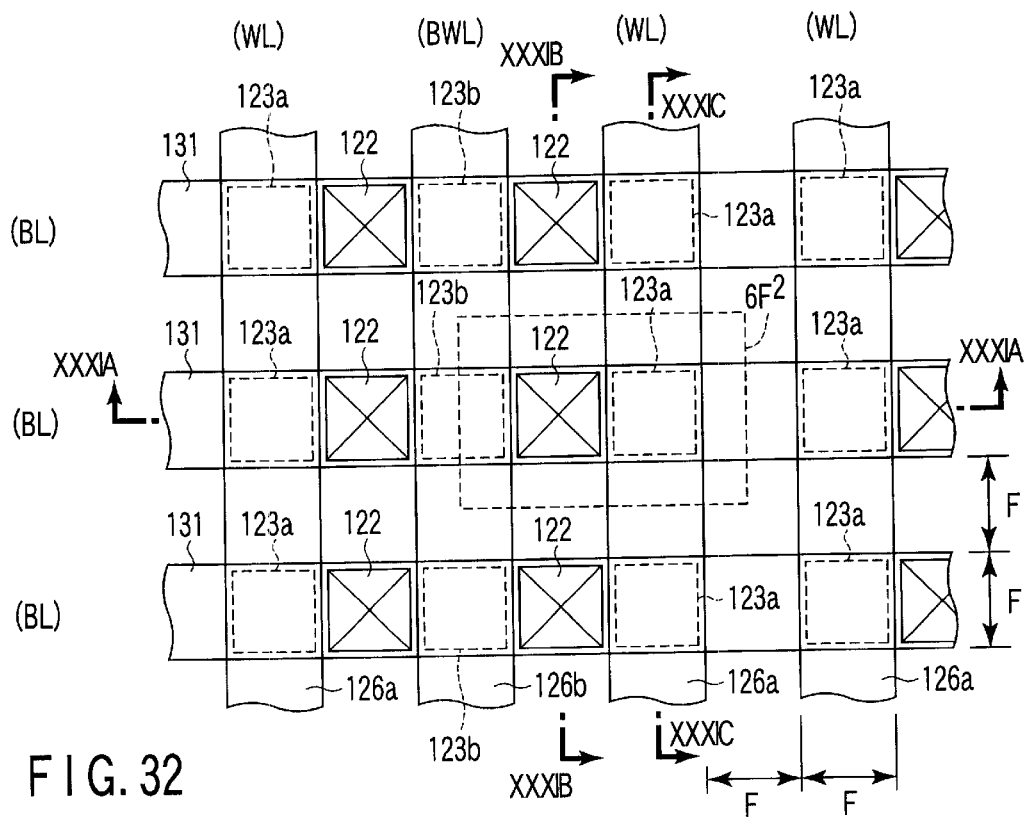
F I G. 32

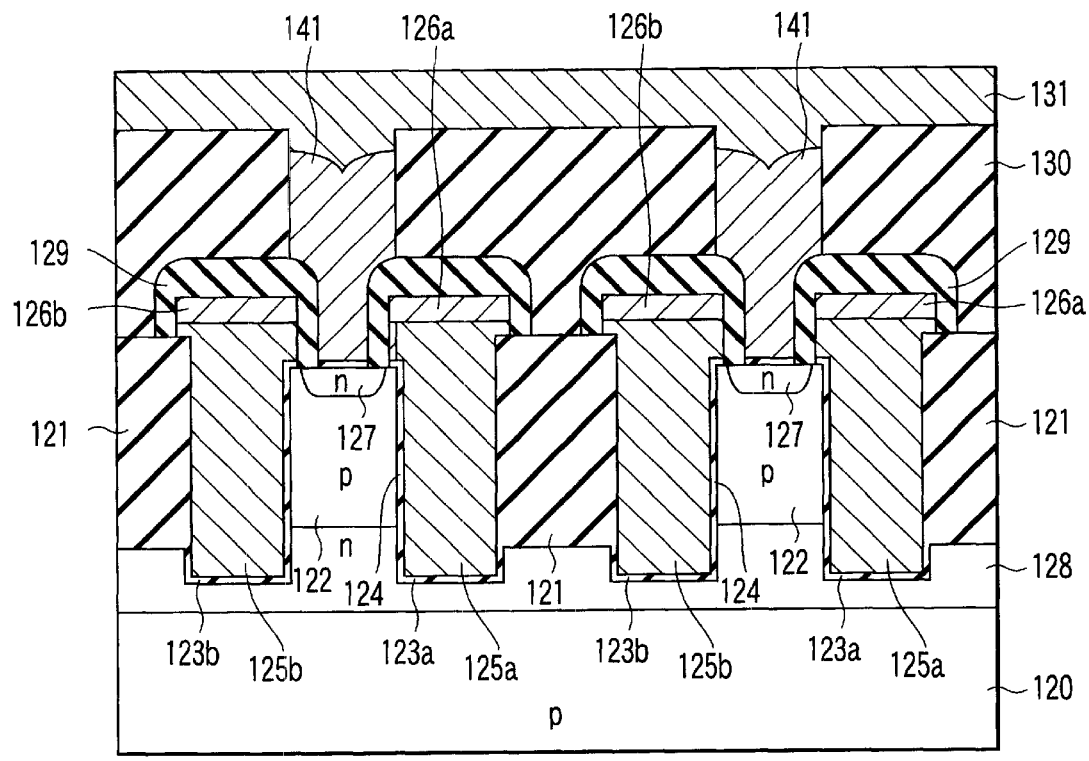
F I G. 31A
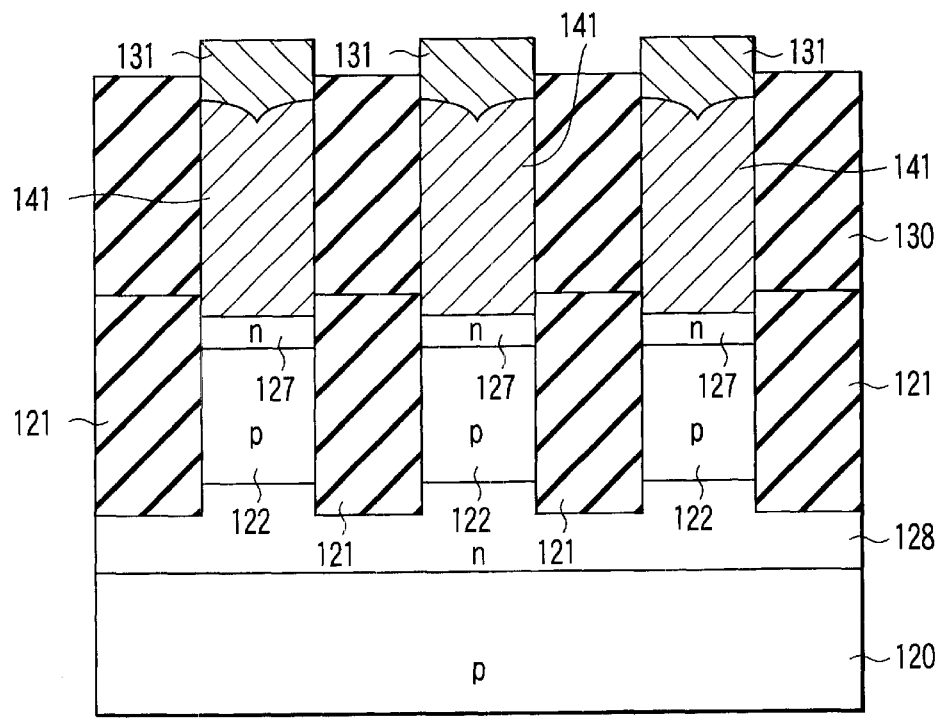
F I G. 31B

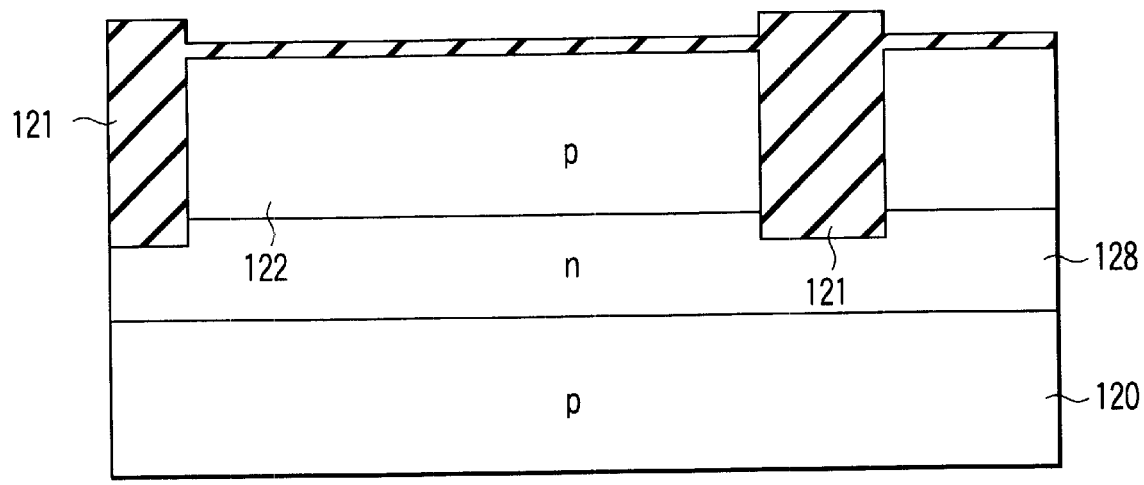
F I G. 36A
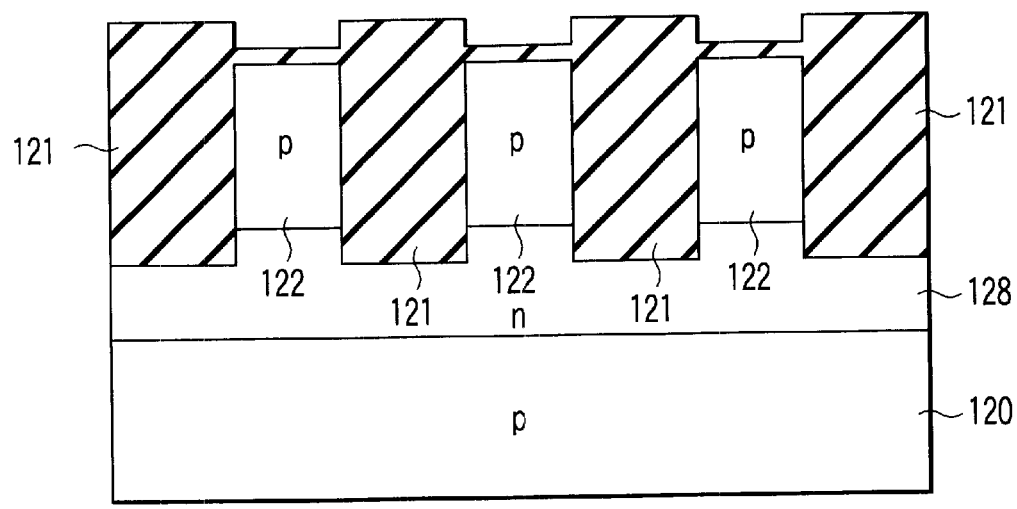
F I G. 36B

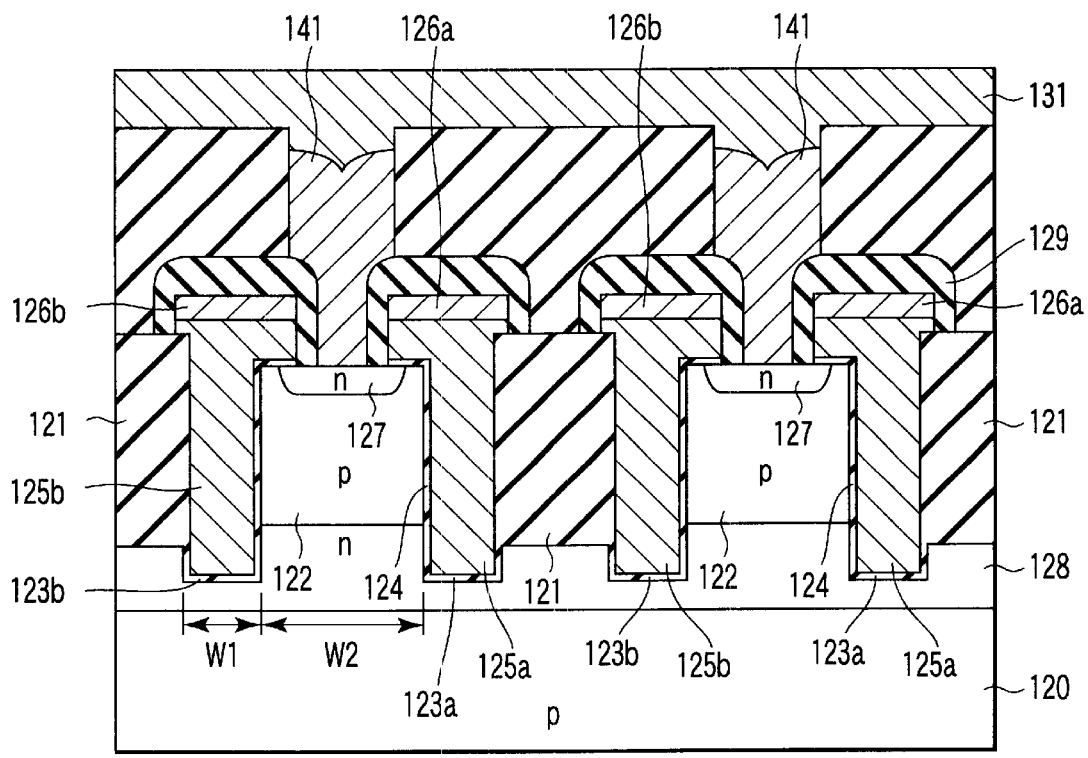
F I G. 41
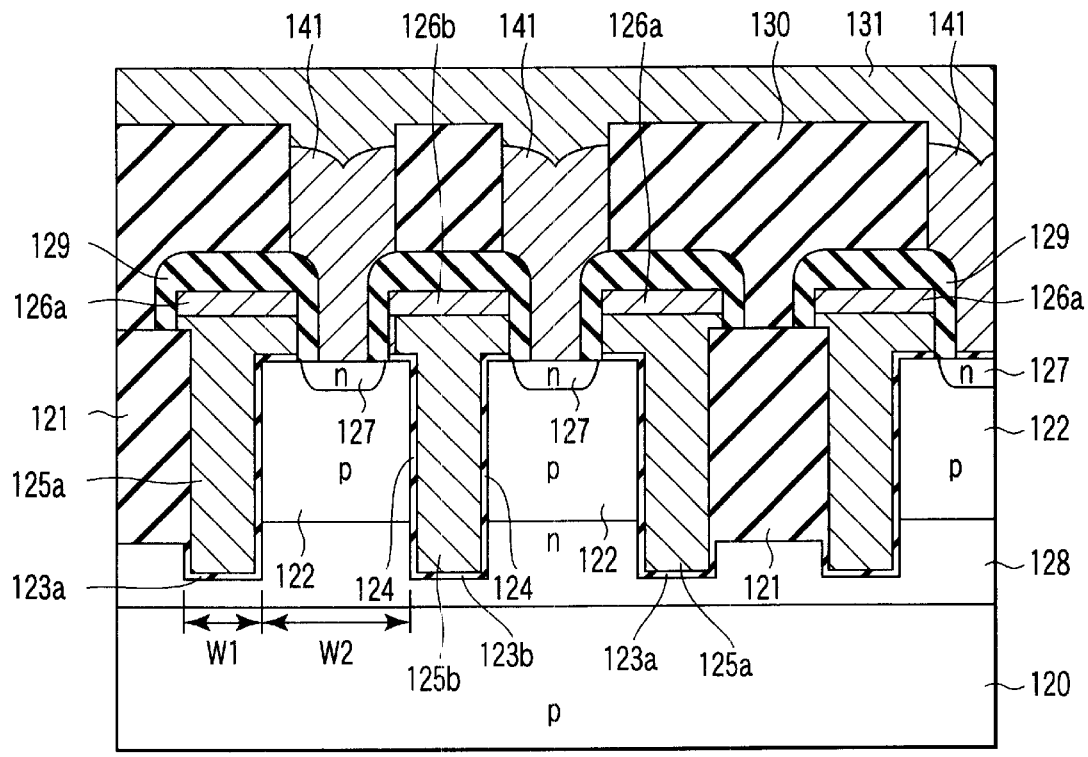
F I G. 42

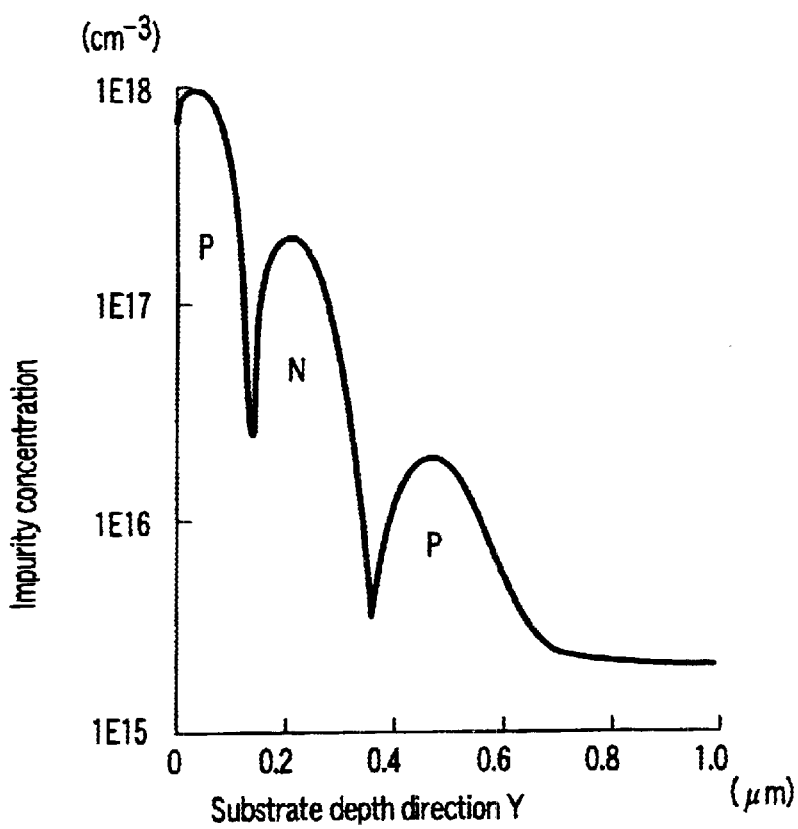
FIG. 46D PRIOR ART
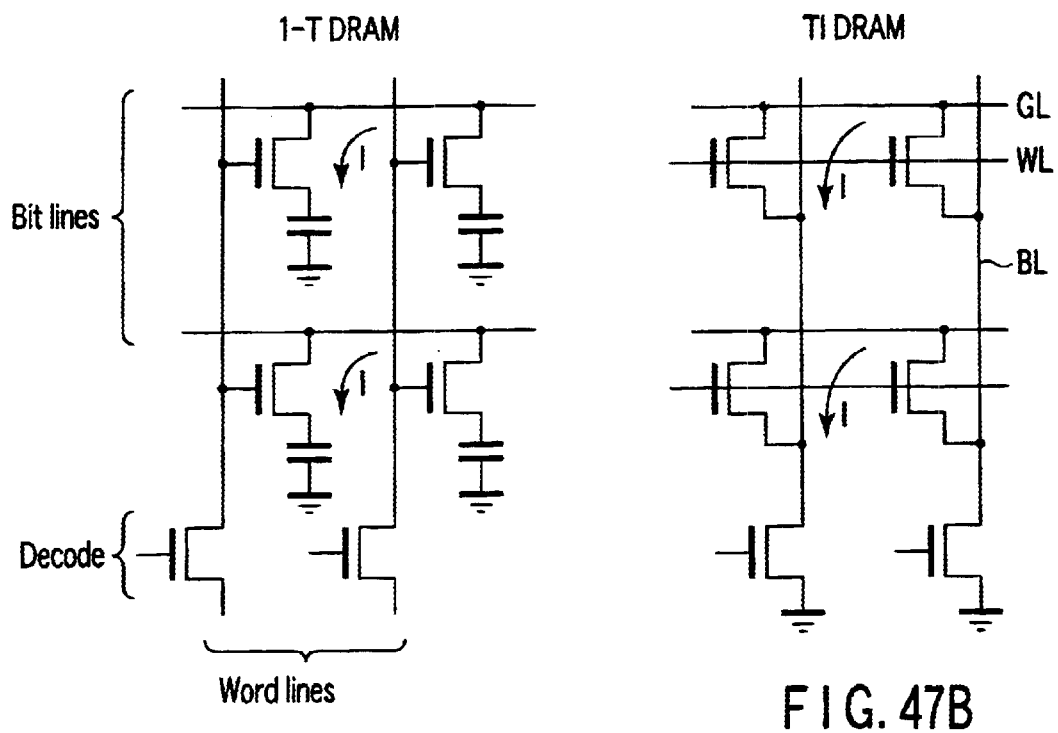
FIG. 47A PRIOR ART
FIG. 47B PRIOR ART

SEMICONDUCTOR DEVICE

CROSS-REFERENCE TO RELATED APPLICATIONS

This application is based upon and claims the benefit of priority from the prior Japanese Patent Applications No. 2001-129908, filed Apr. 26, 2001; and No. 2001-201280, filed Jul. 2, 2001, the entire contents of both of which are incorporated herein by reference.

BACKGROUND OF THE INVENTION

1. Field of the Invention

The present invention relates to a semiconductor device, particularly to a gate structure of an MOS transistor, for example, for use in a dynamic memory integrated circuit.

2. Description of the Related Art

In recent years, for the purpose of suppressing a short channel effect, reducing power consumption and enhancing a driving power, various types of MOS transistors structures such as a double gate type MOS transistor and a surround gate type MOS transistor have been proposed.

FIG. 44 shows a conventional MOS transistor of a double gate structure described in IEDM 97 427–430.

In FIG. 44, reference numeral 211 denotes a drain region in a semiconductor substrate, 212 denotes a source region in the semiconductor substrate, 213 denotes a top gate provided in the upper portion of the semiconductor substrate in a horizontal direction, 214 denotes a bottom gate provided in the lower portion of the semiconductor substrate in the horizontal direction, 215 denotes a channel region in the semiconductor substrate sandwiched between the top gate and the bottom gate, and 216 denotes a gate insulating film for insulating the top gate 213 and the bottom gate 214 from the drain region 211, the source region 212, and the channel region 215.

In the MOS transistor, the top gate 213 and the bottom gate 214 are provided in the upper portion and the lower portion of the semiconductor substrate in the horizontal direction, the channel region 215 is provided between the top gate 213 and the bottom gate 214, thereby to provide a MOS transistor having a double gate structure.

In the MOS transistor having the double gate structure, the bottom gate 214 is positioned just under the top gate 213 and thus functions as a back gate. Therefore, the channel region 215 is depleted, the short channel effect is reduced, the drivability is enhanced, and other effects can be expected.

However, in this case, after forming the back gate 214 and the gate insulating film 216 on the surface of the back gate 214, a single-crystal layer has to be formed as an element region of the MOS transistor. However, the process forming the layer is complex, and it is difficult to enhance the reliability of the device.

FIG. 45 shows another conventional example of the MOS transistor having the double gate structure.

In FIG. 45, reference numeral 221 denotes a drain region in a semiconductor substrate, 222 denotes a source region in the semiconductor substrate, 223 denotes a top gate provided in a vertical direction in the semiconductor substrate, 224 denotes a bottom gate provided in the vertical direction in the semiconductor substrate, 225 denotes a channel region in the semiconductor substrate provided between the top gate 223 and the bottom gate 224, and a gate insulating film (not shown) for insulating the top gate 223 and the bottom gate 224 from the drain region 221, source region 222, and the channel region 225 is formed.

In the MOS transistor of this example, the top gate 223 is provided on the left side in the semiconductor substrate in the vertical direction, the bottom gate 224 is provided on the right sides in the semiconductor substrate in the vertical direction, the channel region 225 is sandwiched between the top gate 223 and the bottom gate 224, thereby forming a MOS transistor having a double gate structure.

However, in this MOS transistor of the double gate structure, it is necessary to process the gates on a step portion, and to vertically introduce impurities, and thus the forming process is complex.

With the conventional MOS transistors as described above, the forming process is complex. In this point of view, there has been a demand for the structure of the MOS transistor which can be realized with a relatively easy processing method and which can provide advantages similar to those effected by the double gate type MOS transistor.

Also, in recent years, various types of DRAMS in which one transistor is used as a memory cell have been proposed as follows.

(1) JOHN E. LEISS et al., "DRAM Design using the Taper-Isolated Dynamic Cell" (IEEE JOURNAL OF SOLID-STATE CIRCUITS, VOL. SC-17, NO. 2 APRIL. 1982, pp 337–344)
(2) Jpn. Pat. Appln. KOKAI Publication No. 1991-171768
(3) Marnix R. Tack et al., "The Multistable Charge-Controlled Memory Effect in SOI MOS transistors at Low Temperatures" (IEEE TRANSACTIONS ON ELECTRON DEVICES, VOL. 37, MAY, 1990, pp 1373–1382)
(4) Hsing-jen Wann et al., "A Capacitorless DRAM Cell on SOI Substrate" (IEDM 93, pp 635–638)

A memory cell of (1) is constituted of a MOS transistor having an embedded channel structure. A parasitic transistor formed on a taper portion of an element isolating insulation film is used to charge or discharge a surface reverse layer, and binary data is stored in accordance with the charge or discharge.

In a memory cell of (2), a well-separated MOS transistor is used, and a threshold value determined by a well potential of the MOS transistor is stored as the binary data.

A memory cell of (3) is constituted of the MOS transistor on an SOI substrate. A hole accumulation in an interface portion generated by applying a large negative voltage from the side of the SOI substrate is utilized, and the binary data is stored in accordance with the charge or discharge of the hole.

A memory cell of (4) is constituted of the MOS transistor formed on the SOI substrate. One MOS transistor is provided in the structure. However, a reverse conductivity layer is superposed upon the surface of the drain diffusion layer so that the substantial structure is such that a writing PMOS transistor and a reading NMOS transistor are substantially combined. The substrate region of the NMOS transistor is used as a floating node, and the binary data is stored in accordance with the potential.

However, in (1), the structure is complicated, and there is a problem in controllability of properties, because the parasitic transistor is used. In (2), the structure is simple, however it is necessary to connect both drain and source to a signal line and control the potential. Moreover, because of the well isolation, a cell size is large, and the data cannot be rewritten for each bit. In (3), it is necessary to control the potential from the SOI substrate side, the data cannot be rewritten for each bit, and there is a problem in controllability. In (4), a unique transistor structure is necessary, the memory cell requires a word line, write bit line, read bit line, and purge bit line, and hence the number of signal lines increases.

BRIEF SUMMARY OF THE INVENTION

According to an aspect of the present invention, there is provided a semiconductor device comprising: a semiconductor substrate; drain and source regions of a MOS transistor formed in a surface of the semiconductor substrate; a gate electrode formed on a surface of a channel region of the MOS transistor between the drain and source regions of the semiconductor substrate with a gate insulating film between the gate electrode and the channel region; and trench type element isolation regions in each of which an insulating film is formed on a surface of a trench formed in the surface of the semiconductor substrate, the element isolation regions sandwiching the channel region from opposite sides thereof in a channel width direction, characterized by further comprising a conductive material layer for a back gate electrode, which is embedded in a trench of at least one of the element isolation regions, configured to be supplied with a predetermined voltage to make an depletion layer in a region of the semiconductor substrate under the channel region of the MOS transistor or to voltage-control the semiconductor substrate region.

According to another aspect of the present invention, there is provided a semiconductor device comprising: an SOI semiconductor substrate in which a silicon layer is formed on an insulating film formed on a supporting semiconductor substrate; drain and source regions of a MOS transistor formed in a surface of the SOI semiconductor substrate; a gate electrode formed on a surface of a channel region of the MOS transistor between the drain and source regions of the semi-conductor substrate with a gate insulating film between the gate electrode and the channel region; and trench type element isolation regions in each of which an insulating film is formed on a surface of a trench formed in the surface of the semiconductor substrate; characterized by further comprising a conductive material layer for a back gate electrode, which is embedded in a trench of at least one of the element isolation regions, configured to be supplied with a predetermined voltage to make an depletion layer in a region of the semiconductor substrate under the channel region of the MOS transistor; a well region formed in a surface of the supporting semiconductor substrate of the SOI semiconductor substrate, a lower end of the conductive material layer being connected to the well region, and the upper portion of the conductive material layer being covered with the insulating film formed on the surface of the element isolation region.

According to a further aspect of the present invention, there is provided a semiconductor device comprising: a memory cell array including an arrangement of MOS transistors for memory cells formed on a semiconductor substrate; a peripheral circuit region formed on the semiconductor substrate; and a plurality of trench type element isolation regions formed in the memory cell array and the peripheral circuit region, the element isolation regions having trenches formed in a surface of the semiconductor substrate, characterized by further comprising a conductive material layer for a back gate electrode, which is embedded in the trench at least one of the element isolation regions, configured to be supplied with a predetermined voltage to make an depletion layer in a region of the semiconductor substrate under a channel region of the MOS transistor or to voltage-control the semiconductor substrate region.

According to a further aspect of the present invention, there is provided a semiconductor memory device characterized by comprising a vertical MOS transistor including: a semiconductor substrate; a first conductive type element region defined in the semiconductor substrate, the element region constituting a channel region; first and second gate electrodes embedded in first and second trenches formed to sandwich the element region, the first and second gate electrodes opposing to side surfaces of the element region; first and second gate insulation films provided between the first gate electrode and the element region and the second gate electrode and the element region, respectively; a second conductive type drain diffusion layer formed on a surface of the element region; and a second conductive type source diffusion layer embedded in semiconductor substrate in a predetermined depth.

According to a further aspect of the present invention, there is provided a manufacturing method of a semiconductor memory device, characterized by comprising: forming an element forming region defined by an element isolation insulating film in a semi-conductor substrate; ion-implanting impurities in the semiconductor substrate; forming a source diffusion layer adjacent to a bottom of the element forming region; forming at least two trenches at a pre-determined distance in the element forming region; forming gate insulating films on side surfaces of an element channel region sandwiched by the two trenches; embedding first and second gate electrodes in the trenches; and forming a drain diffusion layer on the surface of the element channel region.

BRIEF DESCRIPTION OF THE SEVERAL VIEWS OF THE DRAWING

FIG. 7 is a cross sectional view of the channel width direction of the MOS transistor according to the second embodiment of the present invention.

FIG. 8 is a cross sectional view of a semi-conductor memory device using the MOS transistors shown in FIGS. 6 and 7, and schematically shows a structural scheme for electrically connecting a back gate electrode to a conductive material layer of the element isolation region to supply a potential to the conductive material layer.

FIG. 9 is a cross sectional view of the channel width direction of a MOS transistor according to a modification of the second embodiment of the present invention.

FIG. 30 is a plan pattern view of a DRAM cell array according to an eighth embodiment of the present invention.

FIG. 31A is a cross sectional view of the DRAM cell array shown in FIG. 30 taken along the XXXIA—XXXIA line of the plan pattern view of FIG. 30.

FIG. 31B is a cross sectional view of the DRAM cell array shown in FIG. 30 taken along the XXXIB—XXXIB line of the plan pattern view of FIG. 30.

FIG. 32 is a plan pattern view of a DRAM cell array according to a ninth embodiment of the present invention.

FIG. 36A is a cross sectional view of the DRAM cell array shown in FIG. 32 taken along the XXXIIIA—XXXIIIA line of the plan pattern view of FIG. 32, when a source diffusion layer is formed.

FIG. 36B is a cross sectional view of the DRAM cell array shown in FIG. 32 taken along the XXXIIIB—XXXIIIB line of the plan pattern view of FIG. 32, when the source diffusion layer is formed.

FIG. 41 is a cross sectional view of a DRAM cell array according to a tenth embodiment of the present invention and the cross sectional view corresponds to that of FIG. 31A.

FIG. 42 is a cross sectional view of a DRAM cell array according to an eleventh embodiment of the present invention and the cross sectional view corresponds to that of FIG. 33A.

FIG. 46D is an impurity concentration distribution in the depth direction (Y direction) of the semi-conductor substrate region of the TI cell shown in FIG. 46A.

FIG. 47A is a circuit diagram of a dynamic memory (1-T DRAM) cell array comprising conventional one transistor-one capacitor memory cells, in which a current route is shown in comparison with that shown in a circuit diagram shown in FIG. 47B.

FIG. 47B is a circuit diagram of a dynamic memory (TI DRAM) cell array comprising TI memory cells, in which a current route is shown in comparison with that shown in the circuit diagram shown in FIG. 47A.

DETAILED DESCRIPTION OF THE INVENTION

Embodiments according to the present invention will now be described with reference to the drawings.

First Embodiment

Figure 1:
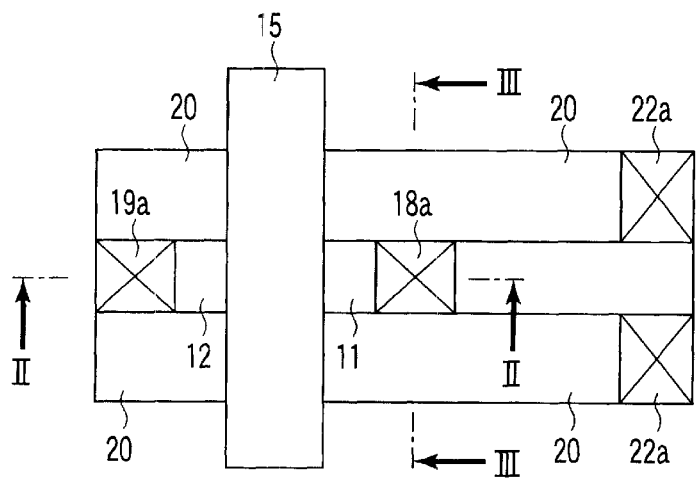
FIG. 1 is a plan view layout of a MOS transistor according to a first embodiment of the present invention.

FIG. 1 is a plan pattern view of a MOS transistor according to a first embodiment of the present invention.

Figure 2:
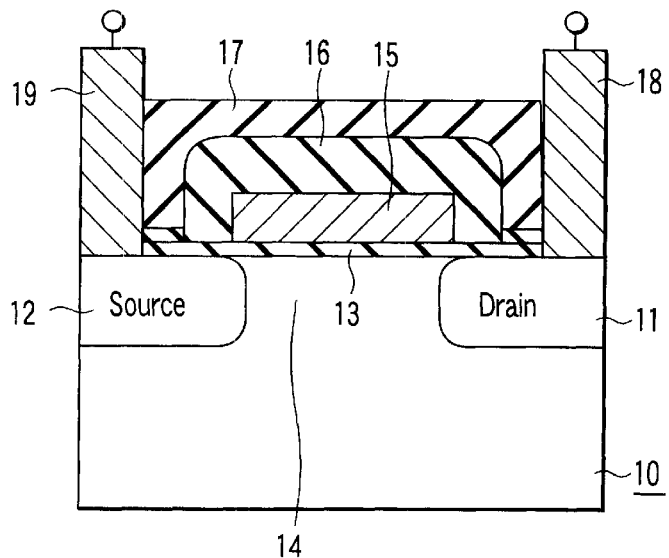
FIG. 2 is a cross sectional view of the channel length direction of the MOS transistor shown in FIG. 1 taken along the II—II line of the cross sectional view in FIG, 1.
Figure 3:
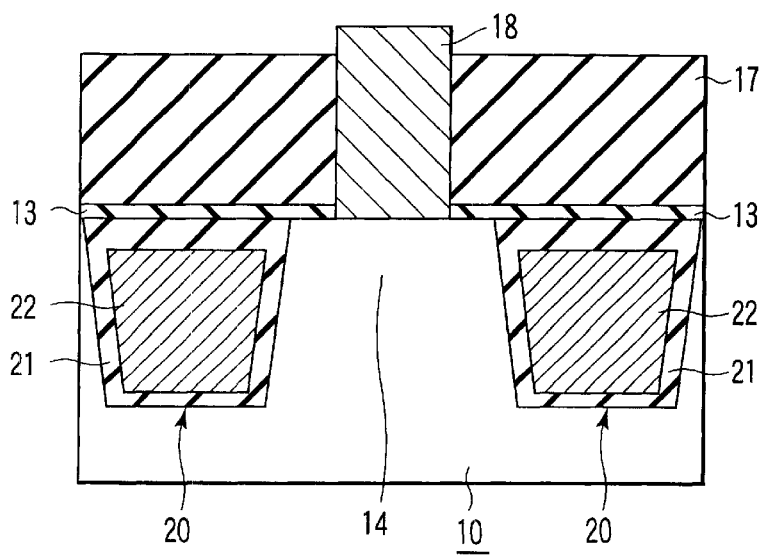
FIG. 3 is a cross sectional view of the channel width direction of the MOS transistor shown in FIG. 1 taken along the III—III line of the cross sectional view in FIG. 1.

FIG. 2 shows one example of a cross sectional structure of the MOS transistor of FIG. 1 along line II—II in FIG. 1, that is, along the channel length direction. FIG. 3 shows one example of the sectional structure of the MOS transistor of FIG. 1 along line III—III in FIG. 1, that is, along the channel width direction.

In FIGS. 1 to 3, reference numeral 10 denotes a semiconductor substrate, 11 and 12 denote a drain region and a source region of the MOS transistor selectively formed in a surface layer of the semi-conductor substrate, 13 denotes a gate insulating film formed on the surface of the semiconductor substrate 10, 14.denotes a channel region between the drain region 11 and the source region 12, 15 denotes a gate electrode formed on the channel region 14 via the gate insulating film 13, 16 denotes a gate protective film formed, for example, of a silicon nitride film formed to cover the gate electrode 15, 17 denotes an interlayer insulating film formed on the semiconductor substrate 10, 18 denotes a drain wiring which contacts the drain region 11, 18a denotes a drain contact portion, 19 denotes a source wiring which contacts the source region 12, and 19a denotes a source contact portion.

Moreover, reference numeral 20 denotes an element isolation region defined by a so-called shallow trench isolation (STI) formed along the channel region 14 of the MOS transistor in the channel length direction. One and another element isolation regions 20 are provided to sandwich the channel region 14 of the MOS transistor from opposite sides in the channel width direction. In each element isolation region 20, a thin insulation film 21 is formed on the surface of a shallow trench, and a conductive material layer (e.g., polysilicon layer) 22 is embedded in the shallow trench. A predetermined potential is applied to the conductive material layer 22 from an upper wiring layer (not shown), for example, via a via-contact (not shown). Reference numeral 22a denotes a contact portion of the conductive material layer 22 with the upper wiring layer. A bias potential may be or may not be applied to the semiconductor substrate 10.

In the MOS transistor of this embodiment, as compared with the conventional MOS transistors, a basic structure (i.e., the structure including the drain/source region, channel region, gate insulating film, and gate electrode) is similar. However, the MOS transistor of this embodiment is different from the conventional MOS transistors in the structure of the element isolation region 20. That is, in this embodiment, in each element isolation region 20, the conductive material layer 22 is provided in the trench of the element isolation region 20. The conductive material layer 22 is embedded in the trench and surrounded by the thin insulating film 21 formed on the surface of the trench. Moreover, during operation of the MOS transistor, a predetermined potential is applied to the conductive material layer 22 as described later. In the conventional MOS transistors, alone an insulating film (oxide film) is embedded in the trench.

Figure 4:
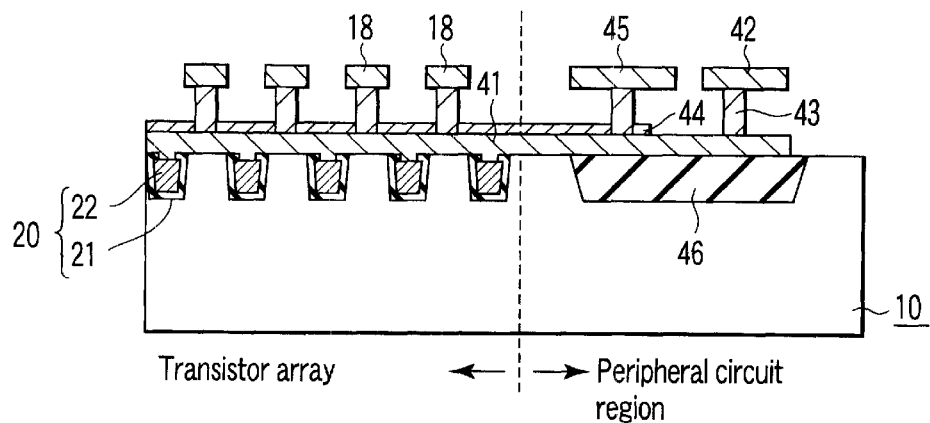
FIG. 4 is a cross sectional view of a semi-conductor memory device using the MOS transistors shown in FIG. 1 to FIG. 3, and schematically shows a structural scheme for electrically connecting a back gate electrode to a conductive material layer of the element isolation region to supply a potential to the conductive material layer.

FIG. 4 is a cross sectional view of the semi-conductor device, and shows a transistor array region and peripheral circuit region in which a plurality of MOS transistors shown in FIGS. 1 to 3 are regularly arranged in the channel width direction. Also, FIG. 4 schematically shows a structural scheme for electrically connecting a back gate electrode 42 to the conductive material layer 22 of the element isolation region 20 to supply a potential to the conductive material layer 22.

In the semiconductor device shown in FIG. 4, connection of the conductive material layer 22 in the element isolation region 20 to a back gate electrode 42 formed on a peripheral circuit region is provided by an upper wiring layer (e.g., polycrystal silicon layer) 41 formed on the semiconductor substrate 10 via a conductive plug 43.

That is, in FIG. 4, the oxide film 21 covering the conductive material layer 22 of each element isolation region 20 is opened in a part of the upper surface of the conductive material layer 22. Moreover, the conductive material layer 22 is connected to the upper wiring layer (i.e. an electrode leading layer) 41 formed on the semiconductor substrate 10 via a contact formed in the opening. The upper wiring layer 41 extends to the peripheral circuit region adjacent to a transistor array region, and is connected to the back gate electrode 42 via the conductive plug 43 formed on the peripheral circuit region. Thereby, the conductive material layer 22 makes contact with the upper back gate electrode 42. Reference numeral 18 denotes the drain electrode of the MOS transistor of the transistor array region, reference numeral 44 denotes a gate wiring layer, and reference numeral 45 denotes a gate electrode which contacts the gate wiring layer 44 in the peripheral circuit region of the transistor array region. Reference numeral 46 denotes an STI type element isolation region formed in the peripheral circuit region of the transistor array region, and an insulating film is embedded in the trench.

The gate wiring layer 44 is constituted of polycrystal silicon doped with impurities at a high concentration. Similarly to the gate wiring layer 44, the conductive material layer 22 and polycrystal silicon 41 are also doped with the impurities at the high concentration so as to avoid depletion.

As described above, with the MOS transistor of the this embodiment, the element isolation regions 20 are provided to sandwich the active region 14 from the opposite sides in the channel width direction and the conductive material layer 22 is embedded in the trenches of the element isolation regions 20. The conductive material layer 22 functions as a back gate electrode of the MOS transistor. That is, the MOS transistor in this embodiment has a gate structure similar to the double gate structure which has been considered as a next generation high-capability MOS transistor.

According to the structure in this embodiment, it is realized by a relatively easy processing method, that the channel region of the MOS transistor is depleted, and the semiconductor substrate region of the MOS transistor is electrically floated, and hence the properties of the MOS transistor is enhanced.

Modification of First Embodiment

In the first embodiment described, the element isolation regions 20 are provided on the opposite sides in the channel width direction of the MOS transistor, and the conductive material layer 22 for the back gate electrode is embedded in the trench of each of the element isolation regions 20 with the oxide film 21 provided between the conductive material layer 22 and the trench. However, the structure may be modified as shown in FIG. 5.

Figure 5:
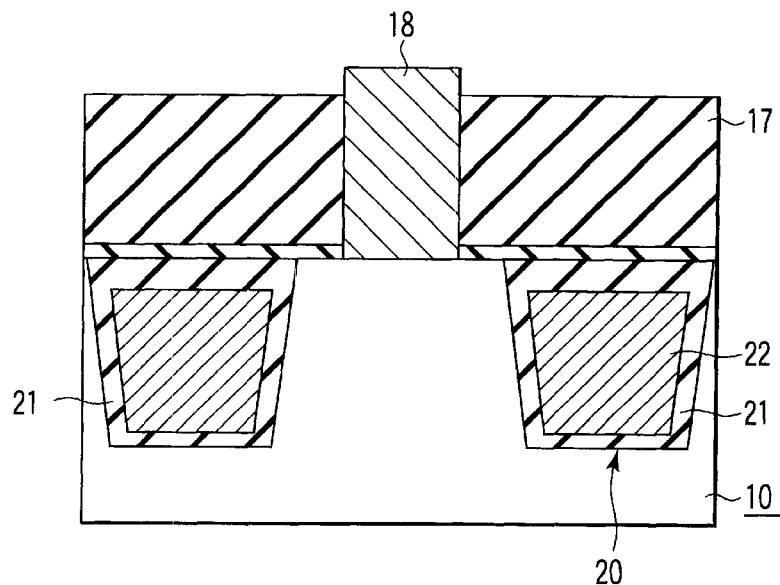
FIG. 5 is a cross sectional view of the channel width direction of a MOS transistor according to a modification of the first embodiment of the present invention.

FIG. 5 is a cross sectional view of the channel width direction of a MOS transistor according to a modification of the first embodiment of the present invention, and the same or corresponding part as that of FIG. 3 is denoted with the same reference numerals.

In the MOS transistor shown in FIG, 5, the element isolation regions 20 are provided on the opposite sides in the channel width direction of the MOS transistor, and the conductive material layer 22 for the back gate electrode is embedded in the trench of one of the two element isolation regions 20 with the oxide film 21 provided between the conductive material layer 22 and the trench. That is, similarly to the first embodiment described, the oxide film 21 is formed on the surface of the trench of one of the two element isolation regions 20, and the conductive material layer 22 for the back gate electrode is embedded in the trench having the oxide film 21 formed on the surface thereof. However, in the other element isolation region 20, the oxide film 21 alone is embedded in the trench, and the conductive material layer 22 is not provided in the trench. This modification differs from the first embodiment in this respect.

For depleting the channel region of the MOS transistor, as in the first embodiment, it is preferable that the conductive material layer 22 for the back gate electrode is embedded in each of the element isolation regions 20 provided on the opposite sides of the channel region in the channel width direction. However, from a point of view of designing or processing the device, there may be a case in which it is preferable that the conductive material layer 22 for the back gate electrode is embedded only in one of the element isolation regions 20 provided at the opposite sides of the cannel regions in the channel width direction.

Additionally, in the MOS transistors of the first embodiment and this modification, a depletion layer width Y in which the depletion layer cannot be generated is represented by the following equation.

$$Y=[2\epsilon(Vg+Vbi/qND)]^{1/2}$$

where,

ε: permittivity

Vg: Gate voltage

Vbi: Built-in potential q: electronic charge

N: Doping concentration

D: Diffusion constant

Therefore, a channel width W of the MOS transistor needs to be smaller than Y, when the conductive material layer 22 is embedded only in one of the element isolation regions 20 provided at the opposite sides of the cannel regions in the channel width direction. On the other hand, the channel width W needs to be smaller than 2Y, when the conductive material layer 22 is embedded in each of the element isolation regions 20 provided at the opposite sides of the cannel regions in the channel width direction.

Moreover, the depth of the oxide film 21 formed on the surface of the groove of the element isolation region 20 needs to be larger than the depth of the drain region 11 and the depth of the source region 12 of the MOS transistor. Moreover, the depth of the conductive material layer 22 embedded in the element isolation region 20 needs to be sufficiently larger than the depth of the channel region 14 of the MOS transistor, or substantially equal to the depth of the element isolation region 20.

Furthermore, it is preferable that the gate insulating film 13 is formed to be sufficiently thin in order to enhance the properties of the MOS transistor. However, when the trench of the element isolation region 20 is made, the surface of the trench becomes more irregular by etching damage, and the breakdown voltage of the MOS transistor tends to drop. From the viewpoint of prevention of the drop of the breakdown voltage, the oxide film 21 formed on the surface of the trench of each element isolation region 20 may be formed to be sufficiently thicker than the gate insulating film 13, or other insulating materials such as an SiN film may be used as the insulating film of the surface of the trench of the element isolation region 20.

Second Embodiment

Figure 6:
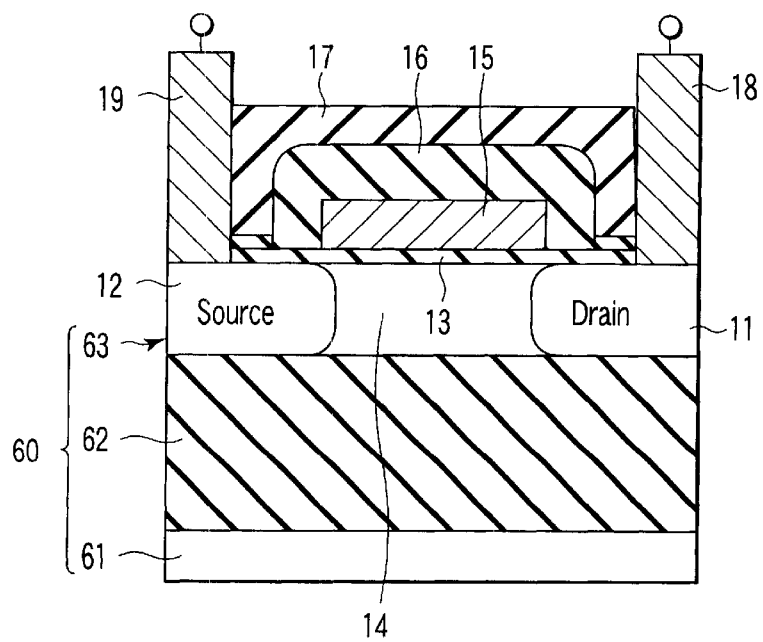
FIG. 6 is a cross sectional view of the channel length direction of a MOS transistor according to a second embodiment of the present invention.

FIG. 6 is a cross sectional view of the channel length direction of a MOS transistor according to a second embodiment of the present invention. FIG. 7 is a cross sectional view of the channel width direction of the MOS transistor according to the second embodiment of the present invention.

The MOS transistor of this embodiment is the same as the MOS transistor of the first embodiment in the basic structure, however is different in that a silicon on insulator (SOI) semiconductor substrate 60 is used as a semiconductor substrate. Since the other structures are the same, the parts corresponding to those of FIGS. 2 and 3 are denoted with the same reference numerals.

In the SOI semiconductor substrate 60, a silicon layer 63 is formed on an insulating film (Box oxide film) 62 formed on a supporting semiconductor substrate, and the drain region 11 and source region 12 of the MOS transistor are selectively formed in the surface layer portion of the silicon layer 63. Moreover, the element isolation regions 20 are formed along the channel region 14 of the MOS transistor in the channel length direction. One and another element isolation regions 20 are provided to sandwich the channel region 14 of the MOS transistor from opposite sides in the channel width direction. The trenches of the element isolation regions 20 are formed to enter within the Box oxide film 62.

FIG. 8 is a cross sectional view of the semiconductor device, and shows a transistor array region and peripheral circuit region in which a plurality of MOS transistors shown in FIGS. 6 and 7 are regularly arranged in the channel width direction. Also, FIG. 8 schematically shows a structural scheme for electrically connecting a back gate electrode 42 to the conductive material layer 22 of the element isolation region.20 to supply a potential to the conductive material layer 22.

In the semiconductor device shown in FIG. 8, connection of the conductive material layer 22 in the element isolation region 20 to the back gate electrode 42 formed on a peripheral circuit region is provided by an upper wiring layer (e.g., polycrystal silicon layer) 41 formed on the semiconductor substrate 10 via a conductive plug 43.

That is, in FIG. 8, the oxide film 21 covering the conductive material layer 22 of each element isolation region 20 is opened in a part of the upper surface of the conductive material layer 22. Moreover, the conductive material layer 22 is connected to the upper wiring layer (i.e. an electrode leading layer) 41 formed on the semiconductor substrate 10 via a contact formed in the opening. The upper wiring layer 41 extends to the peripheral circuit region adjacent to a transistor array region, and is connected to the back gate electrode 42 via the conductive plug 43 formed on the peripheral circuit region. Thereby, the conductive material layer 22 makes contact with the upper back gate electrode 42. Reference numeral 18 denotes the drain electrode of the MOS transistor of the transistor array region, reference numeral 44 denotes a gate wiring layer, and reference numeral 45 denotes a gate electrode which contacts the gate wiring layer 44 in the peripheral circuit region of the transistor array region. Reference numeral 46 denotes an STI type element isolation region formed in the peripheral circuit region of the transistor array region, and an insulating film is embedded in the trench.

The gate wiring layer 44 is constituted of polycrystal silicon doped with impurities at a high concentration. Similarly to the gate wiring layer 44, the conductive material layer 22 and polycrystal silicon 41 are also doped with the impurities at the high concentration so as to avoid depletion.

As described above, similarly to the MOS transistor of the first embodiment, in the MOS transistor in the this embodiment too, the element isolation regions 20 are provided to sandwich the active region 14 from the opposite sides in the channel width direction and the conductive material layer 22 is embedded in the trenches of the element isolation regions 20. The conductive material layer 22 functions as a back gate electrode of the MOS transistor.

Furthermore, in this embodiment, since an SOI semiconductor substrate 60 is used as the substrate, in view of performance, a high operation speed, reduced power consumption, semiconductor substrate bias effect free, and latch up free, etc. can be expected. Moreover, in view of processes, simplification of process steps by obviating the necessity of a well region, and reduction of the chip area can be expected. Furthermore, the semiconductor substrate region of the MOS transistor can completely be formed in the floating body. Therefore, the reduction of a short channel effect, enhancement of drivability, etc. can be expected. The properties are enhanced similarly to the MOS transistor of the double gate structure.

Modification of Second Embodiment

FIG. 9 is a cross sectional view of the channel width direction of a MOS transistor according to a modification of the second embodiment of the present invention, and the same or corresponding parts as those of FIG. 7 are denoted with the same reference numerals.

In the MOS transistor shown in FIG. 9, the element isolation regions 20 are provided to sandwich the active region 14 of the MOS transistor from the opposite sides in the channel width direction, and the conductive material layer 22 for the back gate electrode is embedded in the trench of one of the two element isolation regions 20 with the oxide film 21 provided between the conductive material layer 22 and the surface of the trench. That is, similarly to the second embodiment described, the oxide film 21 is formed on the surface of the trench of one of the two element isolation regions 20, and the conductive material layer 22 for the back gate electrode is embedded in the trench having the oxide film 21 formed on the surface thereof. However, in the other element isolation region 20, the oxide film 21 alone is embedded in the trench, and the conductive material layer 22 is not provided in the trench. This is the difference between this modification and the second embodiment.

For depleting the channel region of the MOS transistor, as in the second embodiment, it is preferable that the conductive material layer 22 for the back gate electrode is embedded in each of the element isolation regions 20 provided on the opposite sides of the channel region in the channel width direction. However, from a point of view of designing or processing the device, there may be a case in which it is preferable that the conductive material layer 22 for the back gate electrode is embedded only in one of the element isolation regions 20 provided at the opposite sides of the cannel regions in the channel width direction.

Third Embodiment

Figure 10:
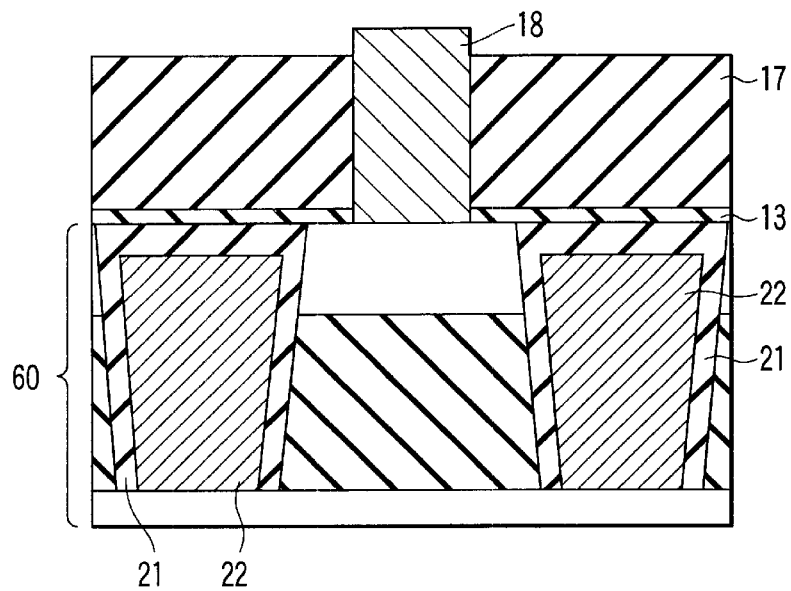
FIG. 10 is a cross sectional view of the channel width direction of a MOS transistor according to a third embodiment of the present invention.
Figure 11:
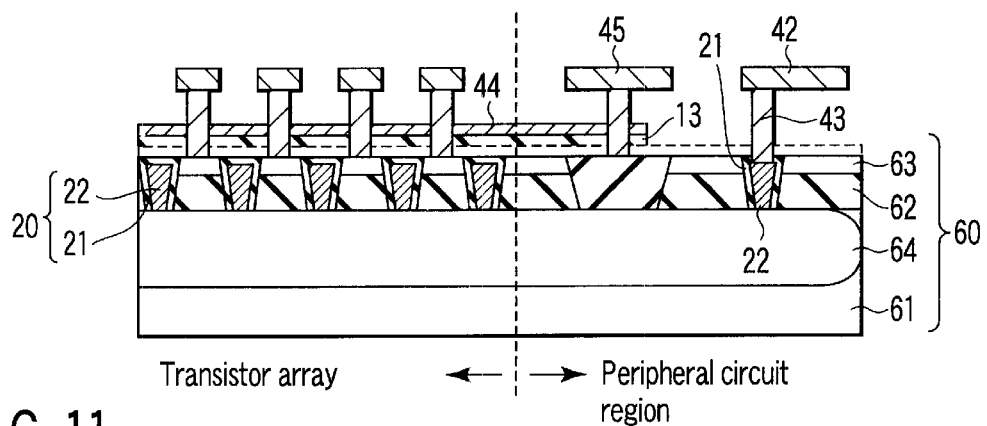
FIG. 11 is a cross sectional view of a semi-conductor memory device using the MOS transistors shown in FIGS. 10 and 11, and schematically shows a structural scheme for electrically connecting a back gate electrode to a conductive material layer of the element isolation region to supply a potential to the conductive material layer.

FIG. 10 is a cross sectional view of the channel width direction of a MOS transistor according to a third embodiment of the present invention. FIG. 11 is a cross sectional view of a semiconductor memory device using the MOS transistors shown in FIG. 10. Also, FIG. 11 schematically shows a structural scheme for electrically connecting a back gate electrode 42 to the conductive material layer 22 of the element isolation region 20 to supply a potential to the conductive material layer 22, and the same or corresponding parts as those of FIG. 8 is denoted with the same reference numerals.

As shown in FIG. 11, the MOS transistor of the this embodiment is different from the MOS transistor of the second embodiment in that (1) a well region 64 is formed in the surface layer portion of the supporting semiconductor substrate 61, and (2) the conductive material layer 22 for the back gate electrode is in contact with the well region 64 of the semiconductor substrate 60, and the other constitutions are the same.

That is, in FIG. 11, the oxide film 21 covering the conductive material layer 22 of each element isolation region 20 is opened in a part of the lower surface of the conductive material layer 22. Moreover, the conductive material layer 22 is connected to the well region 64 of the semiconductor substrate 60 in the opening.

Moreover, a conductive path is formed to the well region 64 from the back gate electrode 42 via the conductive plug 43 and the conductive material layer 22 in the element isolation region 20 in the peripheral circuit region. Thereby, a back gate potential is applied in common to the conductive material layers 22 of the respective element isolation regions 20 of the transistor array region and peripheral circuit region via the well region 64. That is, the upper portion of the oxide film 21 of the element isolation region 20 of the peripheral circuit region is opened, and the conductive plug 43 is connected to the conductive material layer 22 of the element isolation region 20 via a contact formed in the opening. On the other hand, the back gate electrode 42 is connected to the conductive plug 43. Thereby, the back gate electrode 42 is electrically connected to the well region 64 via the conductive plug 43 and the conductive material layer 22 in the element isolation region 20 in the peripheral circuit region. Thereby, the back gate potential can be applied in common to the conductive material layers 22 in the respective element isolation regions 20 of the transistor array region and peripheral circuit region from the back gate electrode 42 via the well region 64.

In the structure of the embodiment, it is unnecessary to particularly consider the wiring scheme, increase of resistance, and the like. Therefore, the structure is effective, when the same back gate potential is simply applied to the conductive material layer 22 in each element isolation region 20 in the transistor array region and peripheral circuit region.

Modification of Third Embodiment

Figure 12:
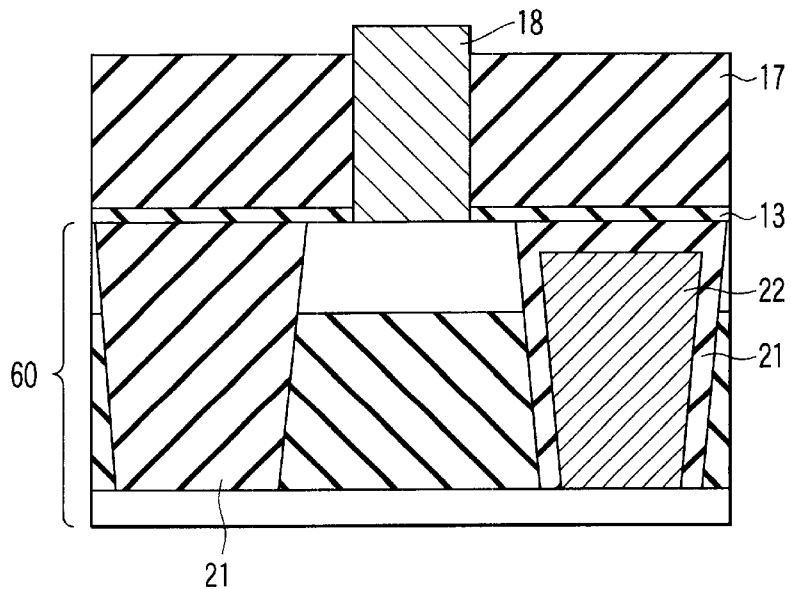
FIG. 12 is a cross sectional view of the channel width direction of a MOS transistor according to a modification of the third embodiment of the present invention.

In the third embodiment, the conductive material layer, 22 for the back gate electrode is embedded via the oxide film 21 in the element isolation regions 20 provided on the opposite sides of the MOS transistor in the channel width direction. However, as shown in FIG. 12, the structure may be changed such that the conductive material layer 22 for the back gate electrode is embedded via the oxide film 21 in the trench of one STI of the element isolation regions 20 provided on the opposite sides of the MOS transistor in the channel width direction, and the oxide film 21 is embedded completely in the other STI.

Fourth Embodiment

In a dynamic memory, in order to reduce the pattern size of a conventional memory cell constituted of one transistor/ one capacitor, a TI cell having a pattern size for one MOS transistor has been proposed as disclosed, for example, in IEEE Trans. Electron Devices, ED-29, No. 4, April 1982. The TI cell has a cross sectional structure, a potential distribution in a semiconductor substrate region plane, and a potential distribution of a semiconductor substrate region depth direction, and an impurity concentration distribution of a semiconductor substrate region depth direction, for example, as shown in FIGS. 46A, 46B, 46C, and 46D, respectively. That is, the structure of a vertical type PNP- transistor is provided in the semiconductor memory device, holes are held in a p-type impurity regions under a gate electrode, and a threshold voltage value of the MOS transistor is changed, so that ON, OFF data can be read/written.

Figure 46A:
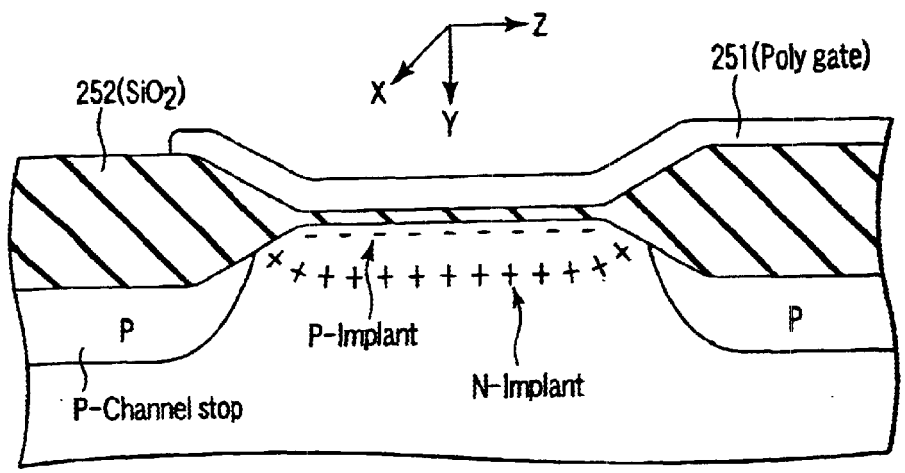
FIG. 46A is a cross sectional view of a conventional TI cell.
Figure 46B:
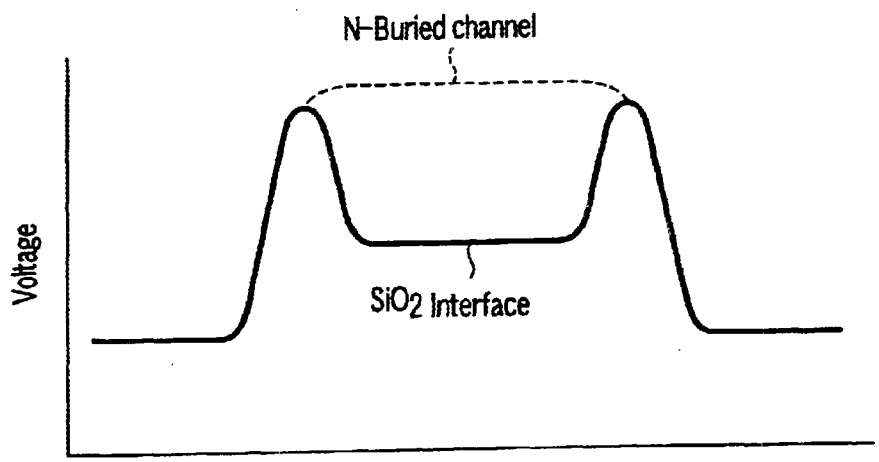
FIG. 46B is a potential distribution in the channel width direction (Z direction) of the semiconductor substrate region of the TI cell shown in FIG. 46A.
Figure 46C:
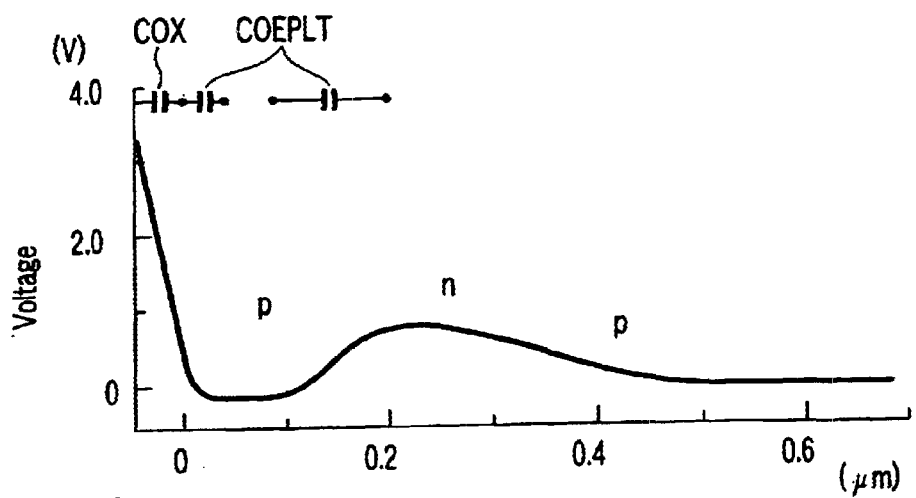
FIG. 46C is a potential distribution in the depth direction (Y direction) of the semiconductor substrate region of the TI cell shown in FIG. 46A.

FIG. 47A shows a circuit diagram of a dynamic memory (1-T DRAM) in which the conventional memory cell including one transistor/one capacitor constitutes a memory cell array and a current route is shown, and FIG. 47B shows a dynamic memory (TI DRAM) in which the TI cell shown in FIG. 46A constitutes a memory cell array and a current route is shown.

In the TI DRAM, WL denotes a word line connected in common to respective gates of the TI cells in the same row, GL denotes a gate direction line connected in common to respective drains of the TI cells in the same row, and BL denotes a bit line connected in common to respective sources of the TI cells in the same column.

The TI cell has a possibility that an impurity profile misalignment portion is generated, and an erroneous operation is performed in the portion of p-type and n-type impurity regions under a gate electrode 251, for example, a polysilicon gate (POLY gate) electrode in contact with the element isolation region (e.g., $SiO_2$) 252. For example, it is assumed that the concentration of the n-type impurity region of the PNP transistor is reduced, and a short-circuit occurs.

To solve the problem, in a fourth embodiment in which the present invention is applied to the TI cell, the back gate electrode is formed in the trench of the STI element isolation region of the TI cell, and the potential is applied. Thereby, the PNP transistor does not turn on and maintains normal operation, and this is advantageous for the device.

Moreover, in the TI cell, the holes are held in the p-type impurity region under the gate electrode 251, however, it is preferable in view of holding the holes if a capacity for accumulating charges exists beside the element isolation region.

Figure 13:
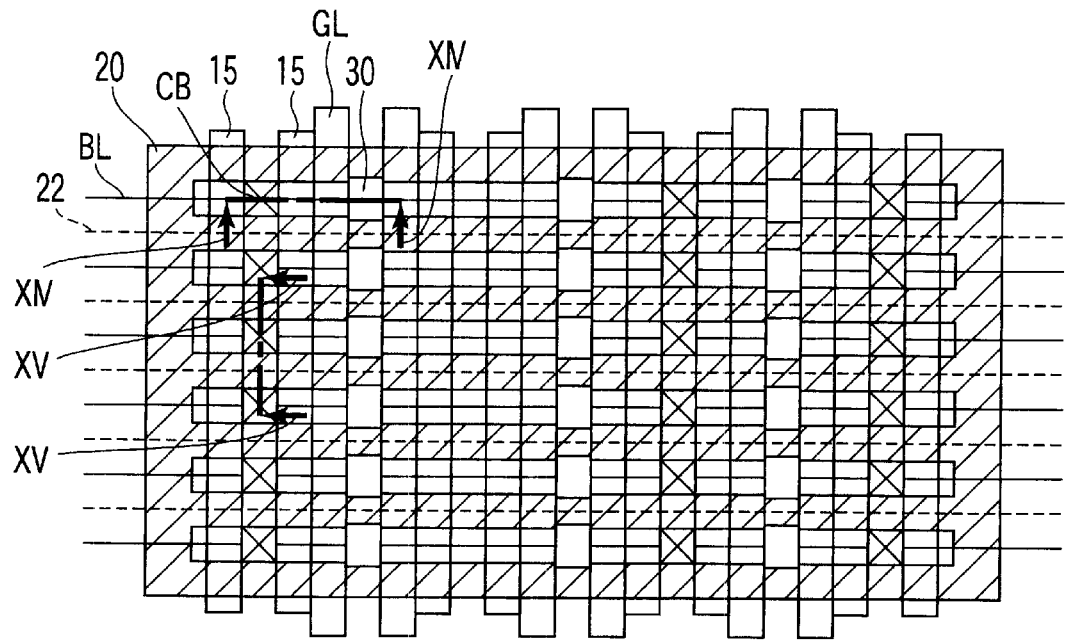
FIG. 13 is a plan pattern view of an array of TI-cells according to a fourth embodiment according to the present invention.

FIG. 13 shows an example of a plane layout of the array in which the TI cells are arranged in matrix in the fourth embodiment. The TI cells provided adjacent to each other in a bit line direction are isolated by an STI element isolation region 30.

Figure 14:
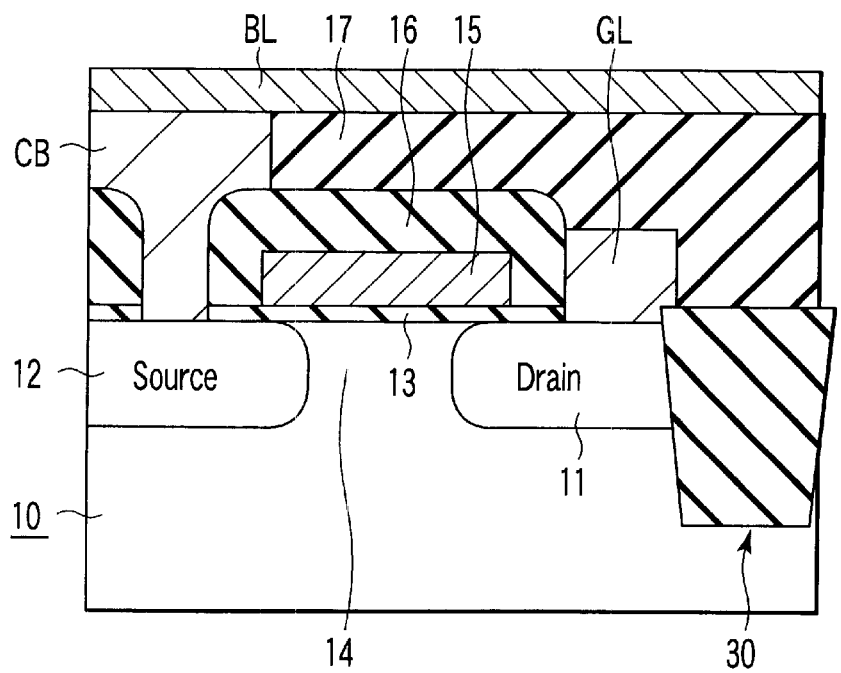
FIG. 14 is a cross sectional view of the channel length direction of a TI-cell of the TI-cell array shown in FIG. 13 taken along the XIV—XIV line of the cross sectional view in FIG. 13.

FIG. 14 shows an example of a cross sectional structure of the TI-cell channel length direction along the XIV—XIV line of FIG. 13.

Figure 15:
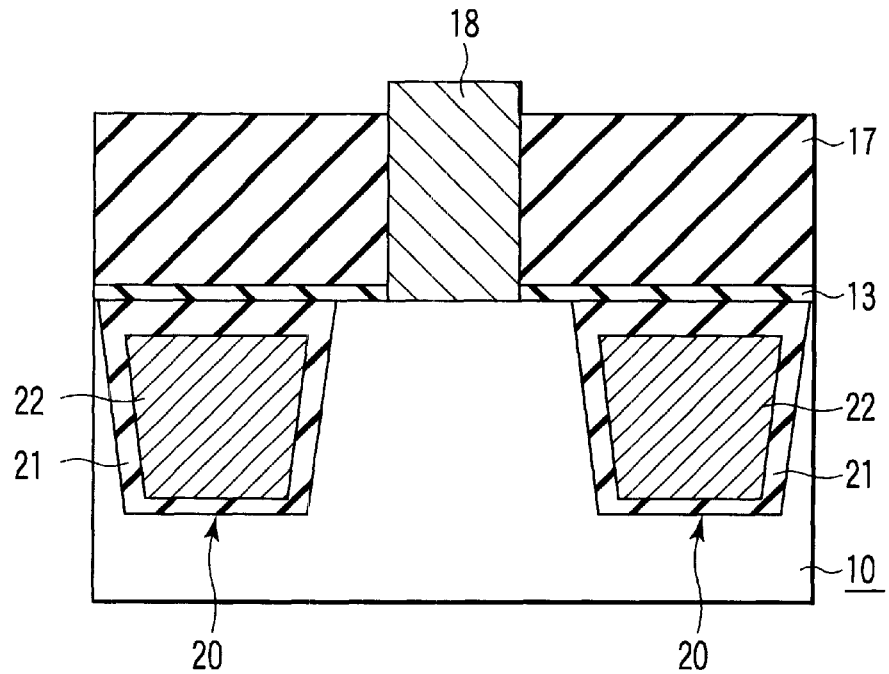
FIG. 15 is a cross sectional view of the channel width direction of a TI-cell of the TI-cell array shown in FIG. 13 taken along the XV—XV line of the cross sectional view in FIG. 13.

FIG. 15 shows an example of a sectional structure of the TI-cell channel width direction along the XV—XV line of FIG. 13.

In FIGS. 13 to 15, reference numeral 10 denotes a semiconductor substrate, reference numerals 11 and 12 denote the drain region and source region of the TI cell selectively formed in the surface layer portion of the semiconductor substrate, and reference numeral 13 denotes a gate insulating film formed on the surface of the semiconductor substrate.

Reference numeral 14 denotes a channel region between the drain region 11 and the source region 12, reference numeral 15 denotes a gate electrode (a part of a word line) formed on the channel region 14 via the gate insulating film 13, reference numeral 16 denotes a gate protective film formed, for example, of a silicon nitride film formed to cover the gate electrode 15, reference numeral 17 denotes an interlayer insulating film formed on the semiconductor substrate 10, Moreover, reference character GL denotes a gate direction line in contact with the drain region, reference character GC denotes a contact portion of the gate direction line, reference character BL denotes a bit line in contact with the source region, and reference character CB denotes a contact portion of the bit line.

Reference numeral 20 denotes the STI surrounding a plurality of TI cells arranged in the bit line direction, the conductive material layer (e.g., polycrystal silicon) 22 is embedded in the trench of the element separation region 20, and the conductive material layer 22 is connected to a back gate line so that the predetermined potential is conducted.

Modification of Fourth Embodiment

Figure 16:
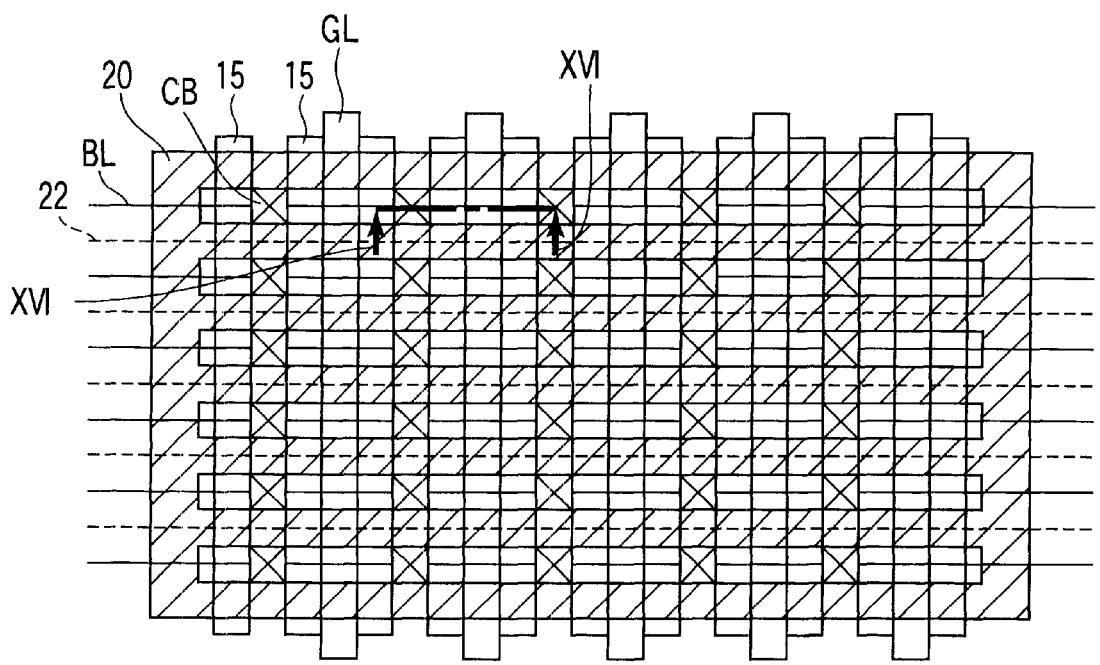
FIG. 16 is a plan pattern view of an array of TI-cells according to a modification of the fourth embodiment according to the present invention.

FIG. 16 shows an example of the plane layout of the array in which the TI cells in the modification of the fourth embodiment are arranged in matrix form.

In the plane layout, the TI cells provided adjacent to each other in the bit line direction share the drain region 11 and the gate direction line GL in contact with the region, and the TI cells provided adjacent to each other in the bit line direction are isolated by the shared drain region 11, so that the size of the bit line direction is reduced.

Figure 17:
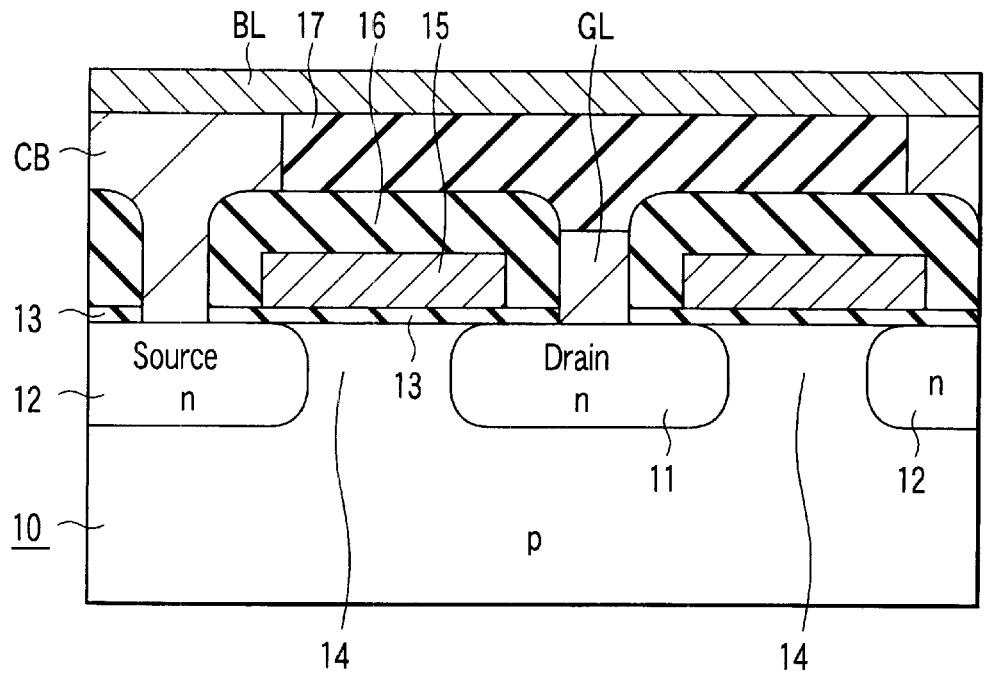
FIG. 17 is a cross sectional view of the channel length direction of a TI-cell of the TI-cell array shown in FIG. 16 taken along the XVII—XVII line of the cross sectional view in FIG. 16.

FIG. 17 shows an example of the sectional structure of the TI-cell channel length direction (bit line parallel direction) along the line XVII—XVII line of FIG. 16. The drain region 11 and source region 12 constituted of n-type impurity diffusion layers are selectively formed in the surface layer portion of the p-type semiconductor substrate 10. The same part as that of FIG. 14 showing the sectional structure of the channel length direction (bit line direction) of the TI cell described in the fourth embodiment is denoted with the same reference numerals.

In the fourth embodiment and the modification example shown in FIGS. 13 to 17, similarly to the first embodiment, the conductive material layer 22 for the back gate electrode embedded in the STI is extracted and contacted from above as shown in FIG. 4, and is processed such that the potential is applied.

Fifth Embodiment

At present, the SOI semiconductor substrate is highlighted for use in logic SI (LSI), since the power consumption is reduced, and the performance is enhanced. In a fifth embodiment, the array of the dynamic memory cells using the TI cells similarly as described in the fourth embodiment with reference to FIG. 13 and a peripheral circuit portion are mounted on the SOI semiconductor substrate in a mixed manner. A dynamic memory LSI can be realized in which the high-capability, and low power consumption MOS transistor is provided in the peripheral circuit portion.

Figure 18:
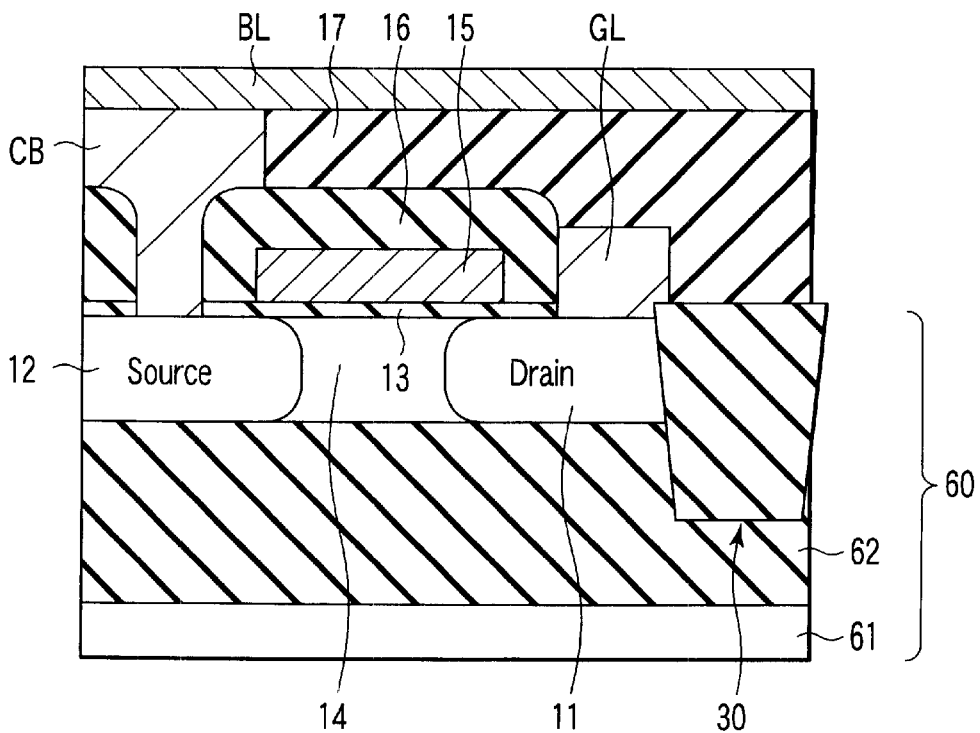
FIG. 18 is a cross sectional view of the channel length direction of a TI-cell according to a fifth embodiment of the present invention.
Figure 19:
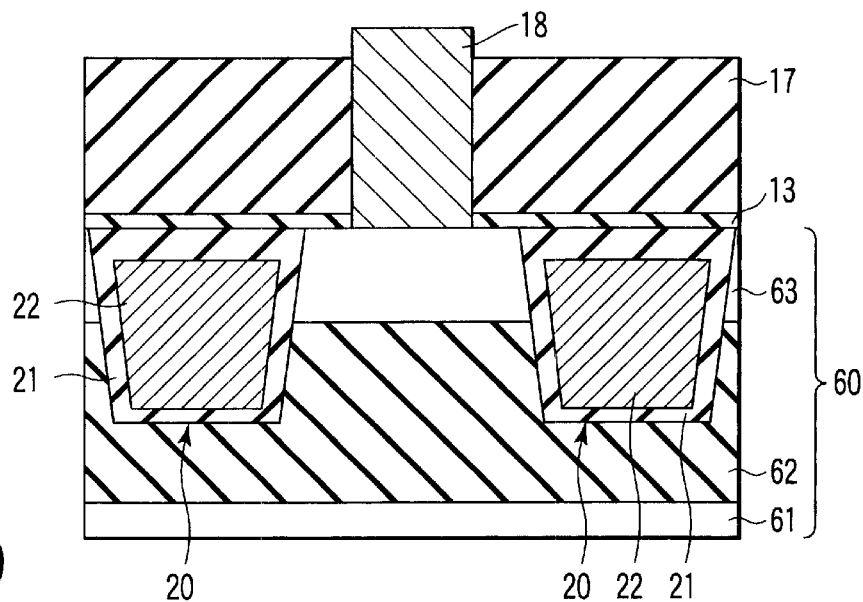
FIG. 19 is a cross sectional view of the channel width direction of the TI-cell according to the fifth embodiment of the present invention.

FIG. 18 shows one example of the sectional structure of the TI-cell channel length direction in the fifth embodiment. FIG. 19 shows one example of the sectional structure of the TI-cell channel width direction according to the fifth embodiment.

Figure 20:
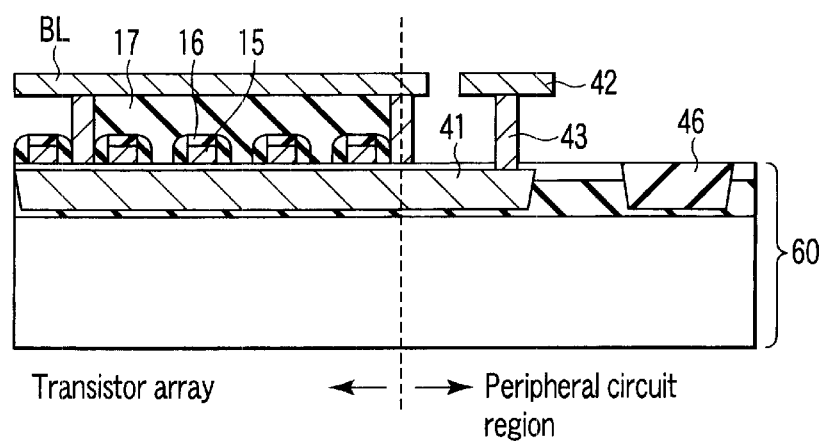
FIG. 20 is a cross sectional view of a semiconductor memory device using the MOS transistors shown in FIGS. 18 and 19, and schematically shows a structural scheme for electrically connecting a back gate electrode to a conductive material layer of the element isolation region to supply a potential to the conductive material layer.

FIG. 20 is a cross sectional view of the semiconductor device, and shows a transistor array region and peripheral circuit region in which a plurality of cells shown in FIGS. 18 and 19 are regularly arranged in a direction. Also, FIG. 20 schematically shows a structural scheme for electrically connecting a back gate electrode 42 to the conductive material layer of the element isolation region to supply a potential to the conductive material layer.

The MOS transistor of this embodiment is the same as the MOS transistor of the fourth embodiment shown in FIGS. 14 and 15 in the basic structure, however is different in that a silicon on insulator (SOI) semiconductor substrate 60 is used as a semiconductor substrate. Since the other structures are the same, the parts corresponding to those of FIGS. 14 and 15 are denoted with the same reference numerals.

In the semiconductor device shown in FIG. 20, connection of the conductive material layer 22 in the element isolation region 20 formed in the TI-cell array region to a back gate electrode 42 formed on a peripheral circuit region is provided by a polycrystal silicon 41 via a conductive plug 43 formed in the peripheral circuit region of the TI cell array region.

Modification of Fifth Embodiment

Figure 21:
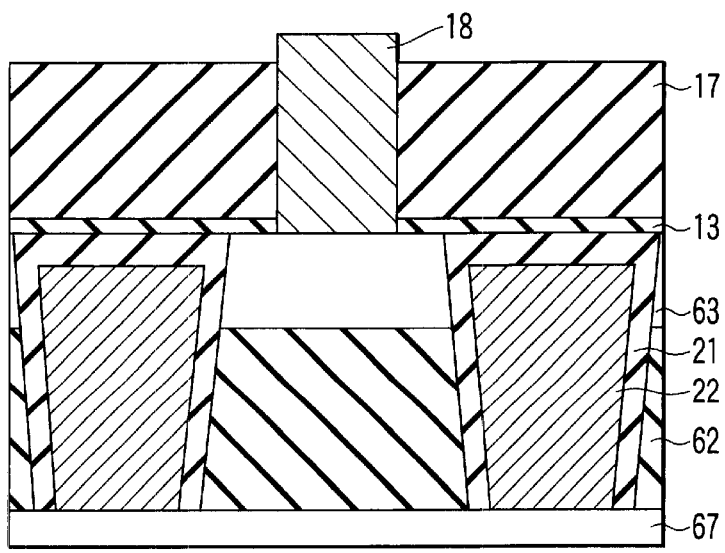
FIG. 21 is a cross sectional view of the channel width direction of a TI-cell according to a modification of the fifth embodiment of the present invention.
Figure 22:
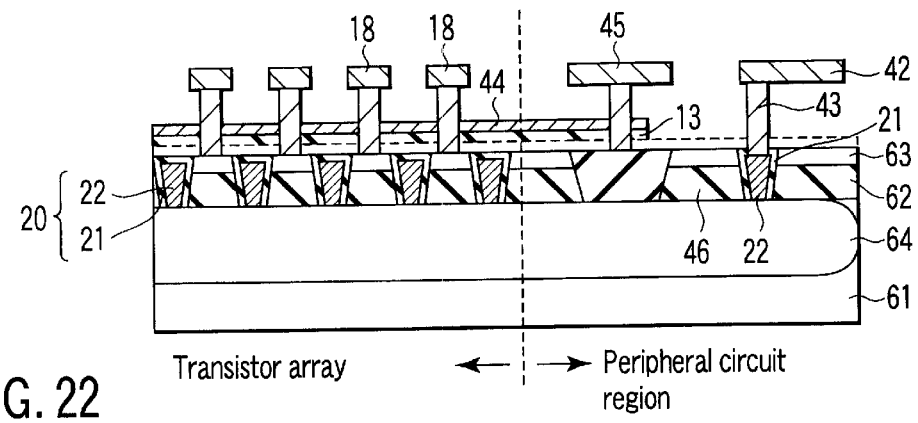
FIG. 22 is a cross sectional view of a semiconductor memory device using the MOS transistors shown in FIG. 21, and schematically shows a structural scheme for electrically connecting a back gate electrode to a conductive material layer of the element isolation region to supply a potential to the conductive material layer.

FIG. 21 is a cross sectional view of the channel width direction of a MOS transistor according to a modification of the fifth embodiment of the present invention. FIG. 22 is a cross sectional view of a semiconductor memory device using the MOS transistors shown in FIG. 21. Also, FIG. 22 schematically shows a structural scheme for electrically a back gate electrode 42 connecting to the conductive material layer 22 of the element isolation region 20 to supply a potential to the conductive material layer 22, and the same or corresponding parts as those of FIG. 21 is denoted with the same reference numerals.

As shown in FIG. 22, the MOS transistor of the this embodiment is different from the MOS transistor of the fifth embodiment in that (1) as shown in FIG. 22, a well region 64 is formed in the surface layer portion of the supporting semiconductor substrate 61, and (2) as shown in FIGS. 21 and 22, the conductive material layer 22 for the back gate electrode is in contact with the well region 64 of the semiconductor substrate 60, and the other constitutions are the same.

That is, in FIG. 22, the oxide film 21 covering the conductive material layer 22 of each element isolation region 20 is opened in a part of the lower surface of the conductive material layer 22. Moreover, the conductive material layer 22 is connected to the well region 64 of the semiconductor substrate 60 in the opening.

Moreover, a conductive path is formed to extend from the well region 64 to the back gate electrode 42 via the conductive plug 43 and the conductive material layer 22 in the element isolation region 20 in the peripheral circuit region. Thereby, a back gate potential is applied in common to the conductive material layers 22 of the respective element isolation regions 20 of the transistor array region and peripheral circuit region via the well region 64.

That is, in FIG. 22, the upper portion of the oxide film 21 of the element isolation region 20 of the peripheral circuit region is opened, and the conductive plug 43 is connected to the conductive material layer 22 of the element isolation region 20 via a contact formed in the opening. On the other hand, the back gate electrode 42 is connected to the conductive plug 43. Thereby, the back gate electrode 42 is electrically connected to the well region 64 via the conductive plug 43 and the conductive material layer 22 in the element isolation region 20 in the peripheral circuit region. Thereby, the back gate potential can be applied in common to the conductive material layers 22 in the respective element isolation regions 20 of the transistor array region and peripheral circuit region from the back gate electrode 42 via the well region 64.

In the structure of this modification, it is unnecessary to particularly consider the wiring scheme, increase of resistance, and the like. Therefore, the structure is effective, when the same back gate potential is simply applied to the conductive material layer 22 in each element isolation region 20 in the transistor array region and peripheral circuit region.

Sixth Embodiment

In a sixth embodiment, similarly to the modification of the fourth embodiment described above with reference to FIG. 16, the array is provided in which the TI cells are arranged, and the SOI semiconductor substrate is used as the semiconductor substrate.

Figure 23:
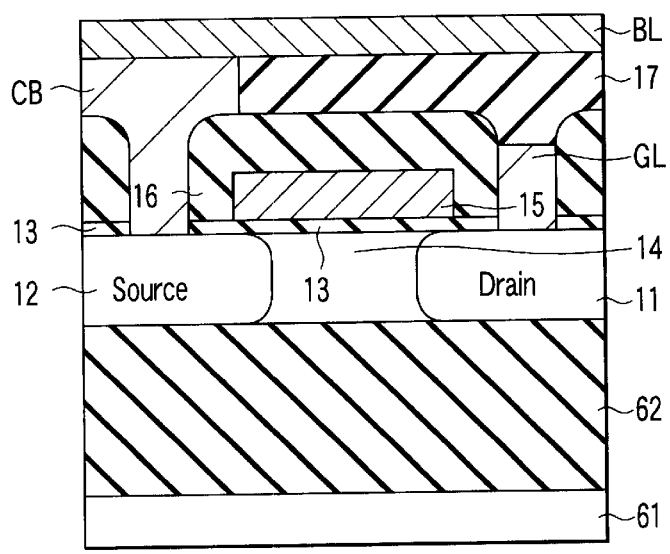
FIG. 23 is a cross sectional view of the channel length direction of a TI-cell according to a sixth embodiment of the present invention.

FIG. 23 is a cross sectional view of the channel length direction of a MOS transistor according to the fifth embodiment.

The MOS transistor of this embodiment is the same as the MOS transistor of the modification of the fourth embodiment in the basic structure, however is different in that a silicon on insulator (SOI) semiconductor substrate 60 is used as a semiconductor substrate. Since the other structures are the same, the parts corresponding to those of FIG. 17 are denoted with the same reference numerals.

Seventh Embodiment

Figure 24:
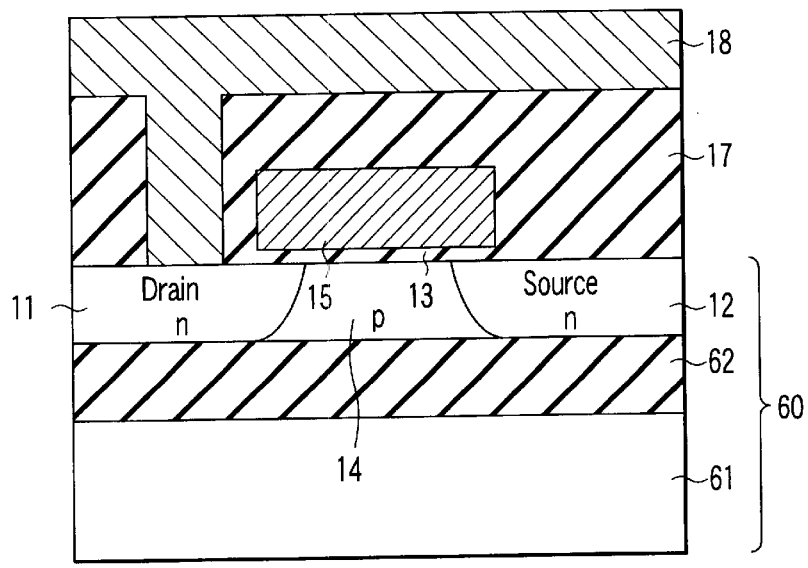
FIG. 24 is a cross sectional view of a DRAM cell being made of a MOS transistor and having a floating channel region, in which an SOI substrate is used.

FIG. 24 shows a semiconductor device comprising a DRAM cell. The memory cell is constituted of an N-channel MOS transistor having an SOI structure. That is, the SOI substrate is used in which a silicon oxide film 62 is formed as an insulating film on a silicon substrate 61, and a p-type silicon layer 63 is formed on the silicon oxide film 62. A gate electrode 15 is formed on the silicon layer 12 of the substrate via a gate oxide film 13, and n-type source and drain diffusion layers 12, 11 are formed on the gate electrode 15 by self-aligning.

The source and drain diffusion layers 12, 11 are formed to a depth such that the layers contact the silicon oxide film 62. Therefore, for the channel region 14 of the p-type silicon layer 63, when the channel region 14 is isolated in a channel width direction (direction crossing at right angles to the surface of a drawing sheet) from the adjacent region by an oxide film, a side surface of the channel width direction is insulated/isolated by the oxide film, the bottom surface is insulated/isolated by the silicon oxide film 62, and a channel length direction has substantially floating state separated by pn-junction.

When a plurality of memory cells are arranged in a matrix, the gate 13 is connected to a word line WL, the source 12 is connected to a fixed potential line (ground potential line), and the drain 11 is connected to a bit line BL.

In an operation principle of the DRAM cell, a potential control of the channel region 14 (p-type silicon layer 14) which is isolated from the adjacent region, that is, floating electrically. That is, when the MOS transistor of the DRAM cell is operated in a pentode tube region, a large current flows to the channel region 14 from the drain diffusion layer 11, and impact ionization occurs in the vicinity of drain junction. Thereby, the channel region 14 can be set to a first potential state in which holes are held as majority carriers, and this state is set, for example, to data "1". On the other hand, the pn-junction between the drain diffusion layer 11 and the p-type silicon layer 12 is biased in a forward direction, and the p-type silicon layer 63 is set to a lower potential. This state is referred to as data "0". The source diffusion layer 12 is held at a fixed potential, for example, a ground potential.

The data "0", "1" are stored as a difference of potential of the channel region, and therefore as a difference of a threshold voltage of the MOS transistor. That is, a threshold voltage Vth1 in the data "1" state in which the potential of the channel region is high by hole accumulation is lower than a threshold voltage Vth0 of the data "0" state. To hold the "1" data state in which the holes as majority carriers are accumulated in the channel region, it is necessary to apply a negative bias voltage to the word line. This data holding state is not changed even with a read operation until a write operation (erase) of reverse data is performed. That is, different from a DRAM of one transistor/one capacitor using charge accumulation of the capacitor, nondestructive reading is enabled.

Figure 25:
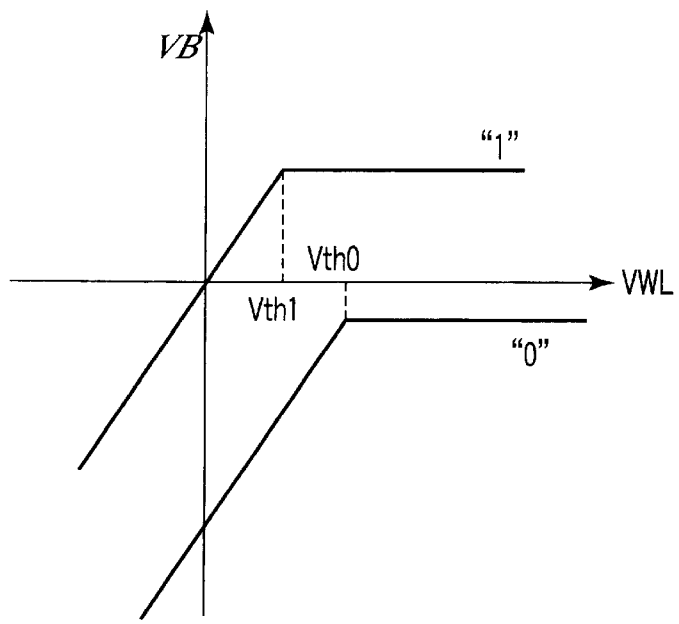
FIG. 25 is a characteristic diagram showing a relationship between a word line potential VBL and a channel region potential VB of the DRAM cell shown in FIG. 24.

Some systems for reading the data have been considered. A relation between a word line potential VWL and a channel region potential VB corresponds to a relation between the data "0" and "1" as shown in FIG. 25. Therefore, for example, a first method of reading the data comprises: applying an intermediate potential between the threshold voltages Vth0 and Vth1 of the respective data "0" and "1"; and using a constitution in which no current flows through the memory cell of the "0" data and the current flows through the memory cell of the "1" data. Specifically, for example, the bit line BL is pre-charged at a predetermined potential VBL, and subsequently the word line WL is driven. Thereby, with the "0" data, the bit line pre-charge potential VBL is unchanged. With the "1" data, the pre-charge potential VBL drops.

A second reading method comprises: energizing the word line WL; supplying a current to the bit line BL; and using a constitution in which a voltage rising rate of the bit line potential differs in accordance with conductivity of "0" and "1". Specifically, for example, the method comprises: pre-charging the bit line BL to 0V; energizing the word line WL; and supplying a bit line current. In this case, when a dummy cell is used to detect a difference of a potential rise of the bit line, the data can be distinguished.

When the "0" data is selectively written, that is, when the hole is discharged only from the channel region of the memory cell selected by the potential of the word line WL and bit line BL selected from a plurality of memory cell arrays, capacity coupling between the word line WL and the channel region is an intrinsic problem. With the hole accumulated in the channel region for the data "1" the word line is biased in a sufficiently negative direction, and needs to be held in a state in which the capacity between the gate and substrate of the memory cell is substantially a gate oxide film capacity (i.e., in a stat in which a depletion layer is not formed on the surface of the channel region).

In FIG. 24, the SOI structure is used to constitute the MOS transistor having the floating channel region.

Figure 26:
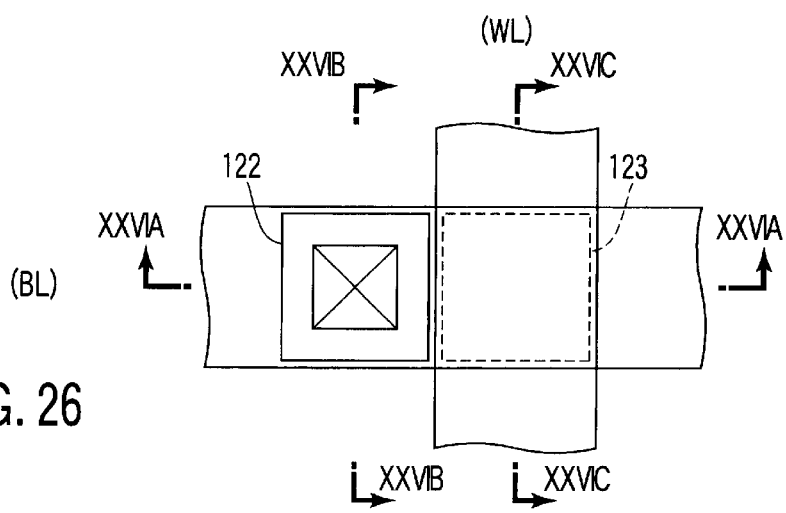
FIG. 26 is a plan pattern view of a DRAM cell being-made of a MOS transistor and having a floating channel region, in which an SOI substrate is not used.
Figure 27A:
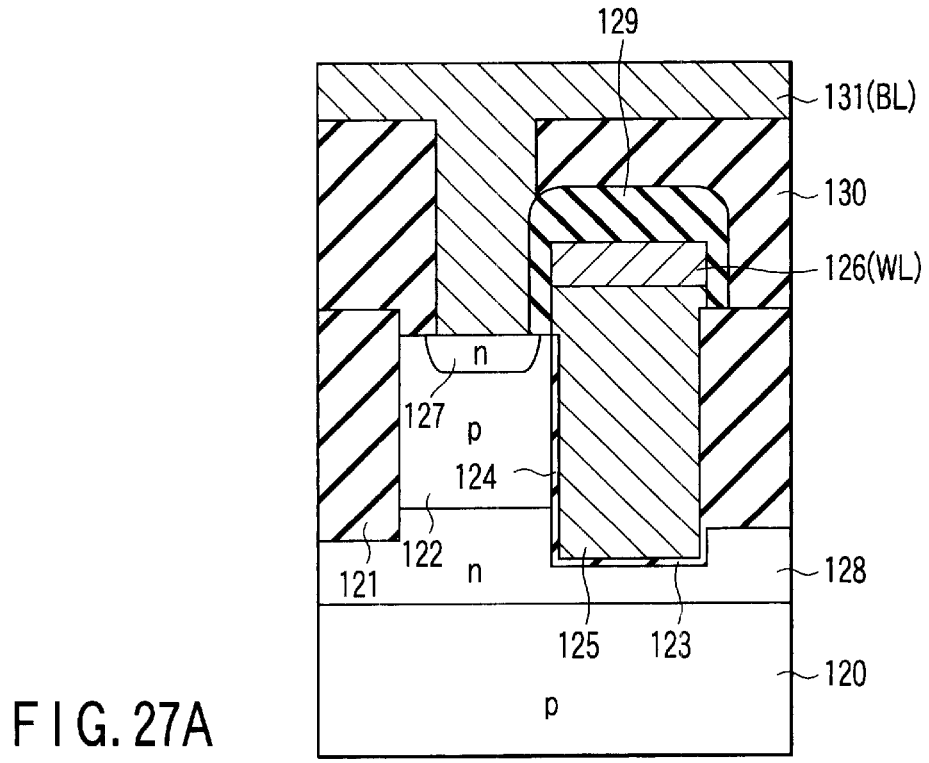
FIG. 27A is a cross sectional view of the DRAM cell shown in FIG. 26 taken along the XXVIIA—XXVIIA line of the plan pattern view of FIG. 26.
Figure 27B:
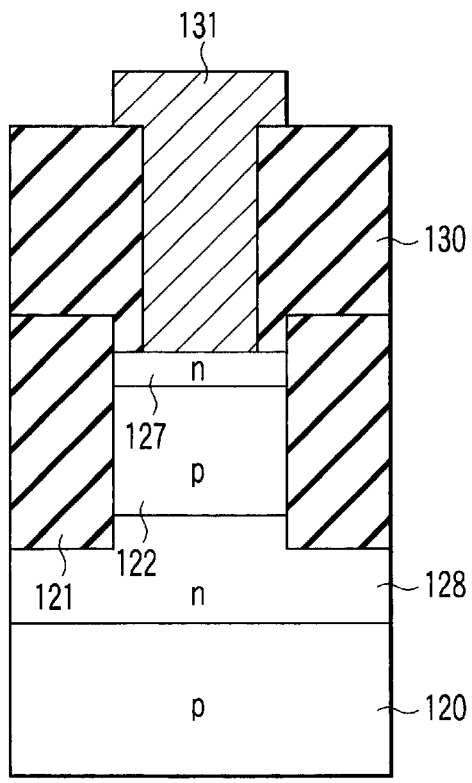
FIG. 27B is a cross sectional view of the DRAM cell shown in FIG. 26 taken along the XXVIIB—XXVIIB line of the plan pattern view of FIG. 26.
Figure 27C:
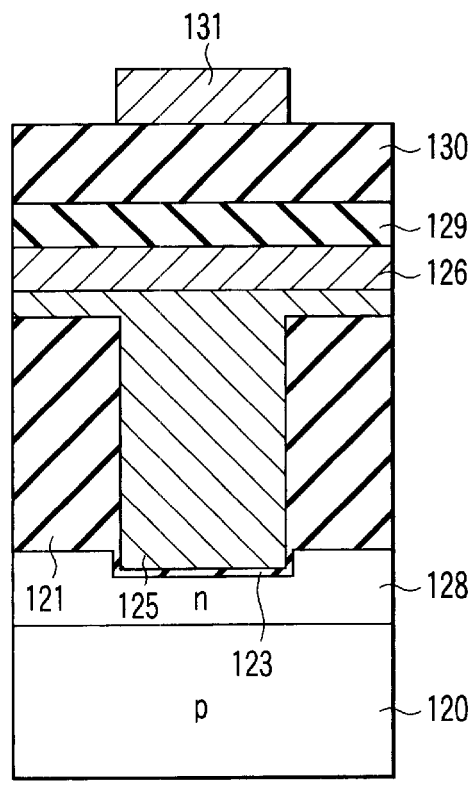
FIG. 27C is a cross sectional view of the DRAM cell shown in FIG. 26 taken along the XXVIIC—XXVIIC line of the plan pattern view of FIG. 26.

However, the MOS transistor having the floating channel region is constituted without using the SOI substrate. The constitution of a basic unit memory cell MC is shown in FIGS. 26 and 27A to 27C. FIG. 26 is a plan view, and FIGS. 27A, 27B and 27C are XXVIIA—XXVIIA line, XXVIIB—XXVIIB line, and XXVIIC—XXVIIC line cross sectional view of FIG. 26.

That is, in the present embodiment, the memory cell MC is constituted of a vertical MOS transistor. An element isolation insulating film 121 is embedded in a p-type silicon substrate 120, for example, by a shallow trench isolation (STI) method, and an element forming region is defined. A trench 123 deeper than the element isolation insulating film 121 is formed in one end of the element forming region. Moreover, a gate insulating film 124 is formed in a side surface of an element channel region 122 forming the channel region exposed to the trench 123. A gate electrode 125 is embedded in the trench 123. An n-type drain diffusion layer 127 is formed on the surface of the element channel region 122. Moreover, an n-type source diffusion layer 128 is formed in a predetermined depth position of the p-type silicon substrate 120 so as to cross the element channel region 122.

In this manner, the vertical MOS transistor having the floating channel region 122 isolated from the adjacent region by the source diffusion layer 128 and element isolation insulating film 121 constitutes the memory cell. When a plurality of memory cells MC are arranged in a matrix to constitute a memory cell array, the source diffusion layer 128 is continuously formed as a common layer to a plurality of MOS transistors. Moreover, the gate electrodes 25 of the MOS transistors arranged in a first direction are connected in common to a metal wiring 126 as the word line WL. The drain diffusion layers 127 of the MOS transistors arranged in a second direction intersecting the first direction are connected to a bit line (BL) 131 provided on an interlayer insulating film 130.

In the basic DRAM cell described above, a degree of increase of the threshold voltage difference of the data "0" and "1" is an important point in the operation principle. As apparent from the operation principle, when the channel region potential is controlled by the capacity coupling of the gate and channel region 122, data write property and hold property are determined. However, since the threshold voltage works substantially as a square root value with respect to the channel region potential, it is not easy to realize a large threshold voltage difference of the "0" and "1" data. Additionally, the "0" write memory cell performs a pentode tube operation in the above-described write operation. When the channel is formed, the capacity coupling is not realized between the gate and the channel region, and the channel region potential cannot rise.

To solve the problem, with respect to the basic DRAM cell structure described in FIGS. 26 and FIGS. 27A to 27C, separately from a main gate electrode (first gate electrode) for use in forming the channel, an auxiliary gate electrode (second gate electrode) for capacity-coupling to the channel region of MOS transistor and controlling the channel region potential is provided. The second gate electrode is driven, for example, in synchronization with the first gate electrode. Thereby, secure writing is enabled, and the threshold voltage difference of the "0" and "1" data can be increased. Alternatively, the second gate electrode is set, for example, to a fixed potential lower than a source potential, and a second gate electrode side is kept in majority carriers accumulated state, so that the threshold voltage difference of the "0" and "1" data can similarly be increased.

Figure 28:
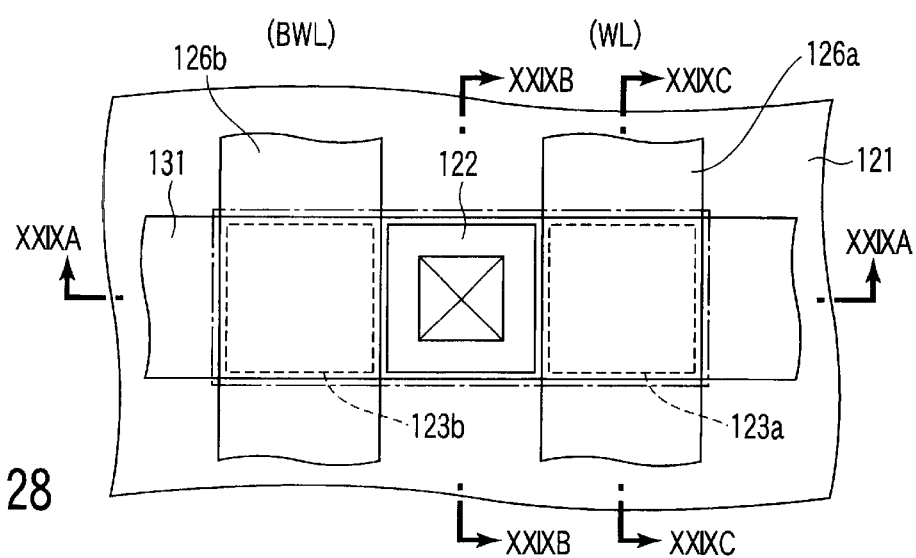
FIG. 28 is a plan pattern view of a DRAM cell comprising a vertical type MOS transistor according to a seventh embodiment of the present invention.
Figure 29A:
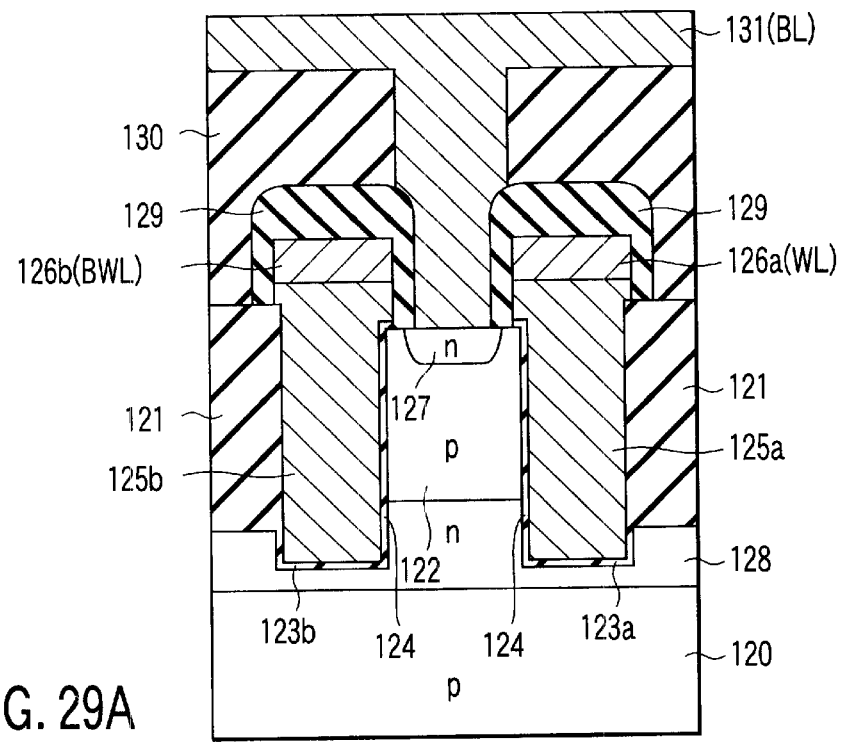
FIG. 29A is a cross sectional view of the DRAM cell shown in FIG. 28 taken along the XXIXA—XXIXA line of the plan pattern view of FIG. 28.
Figure 29B:
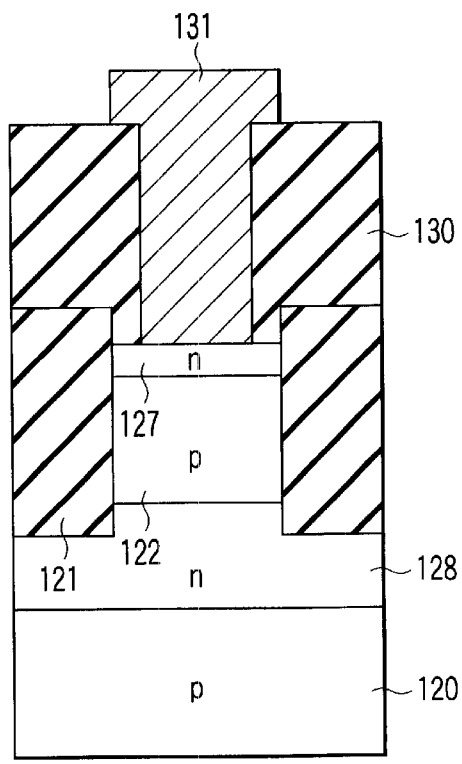
FIG. 29B is a cross sectional view of the DRAM cell shown in FIG. 28 taken along the XXIXB—XXIXB line of the plan pattern view of FIG. 28.
Figure 29C:
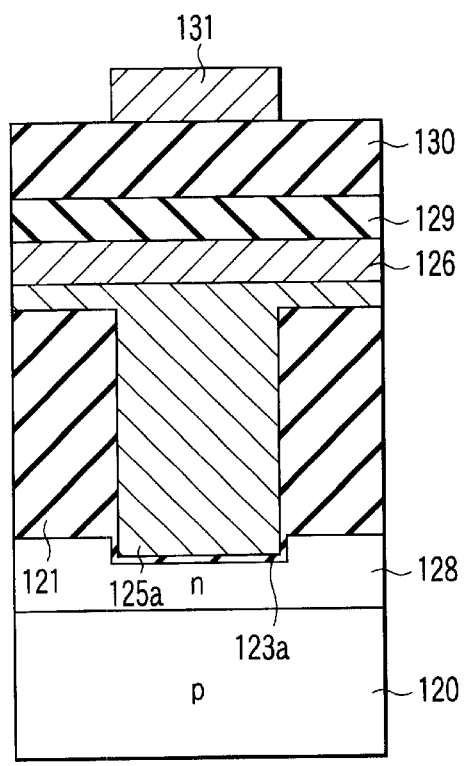
FIG. 29C is a cross sectional view of the DRAM cell shown in FIG. 28 taken along the XXIXC—XXIXC line of the plan pattern view of FIG. 28.

FIG. 28 is a plan view of the vertical MOS transistor as the DRAM cell according to the seventh embodiment, and FIGS. 29A, 29B and 29C are XXIXA—XXIXA line, XXIXB—XXIXB line and XXIXC—XXIXC line cross sectional views of FIG. 28.

The element isolation insulating film 121 is embedded in the p-type silicon substrate 120 by the STI process, and a rectangular element forming region is defined as shown by a one-dot chain line in FIG. 28. Trenches 123a, 123b are formed to be deeper than the bottom portion of the element isolation insulating film 121 in opposite ends of the longitudinal direction of the element forming region. The region 122 held between these trenches 123a, 123b is an element channel region which forms the channel region. Moreover, gate insulating films 124 are formed on opposite side surfaces of the element channel region 122 exposed to the trenches 123a, 123b. Furthermore, gate electrodes 125a, 125b are embedded in the trenches 123a, 123b.

Ions are implanted before a step of forming the trenches and embedding the gate electrodes 125a, 125b, and thereby the n-type source diffusion layer 128 is formed in the bottom of the element channel region 122. After embedding the gate electrodes 125a, 125b, the ions are implanted in the surface of the element channel region 122, and the n-type drain diffusion layer 127 is formed. In this manner, the vertical MOS transistor in which two gate electrodes 125a, 125b are embedded constitutes the memory cell.

The gate electrodes 125a, 125b are connected to metal wirings 126a, 126b which constitute the word line WL and back word line BWL, respectively. The upper portions and side surfaces of these word line WL and back word line BWL are coated with silicon nitride films 129. Additionally, in an actual manufacturing process, as described later, polycrystal silicon films constituting the gate electrodes 125a, 125b are embedded in the trenches 123a, 123b, and deposited/formed to be flat. Furthermore, after continuously depositing a metal wiring layer and silicon nitride film, and patterning these deposited films, the word line WL and back word line BWL are formed.

The interlayer insulating film 130 is formed on the MOS transistor formed in this manner, and the bit line (BL) 131 is further provided. The bit line 131 is connected to the drain diffusion layer 127 of the MOS transistor.

Eight Embodiment

Figure 31C:
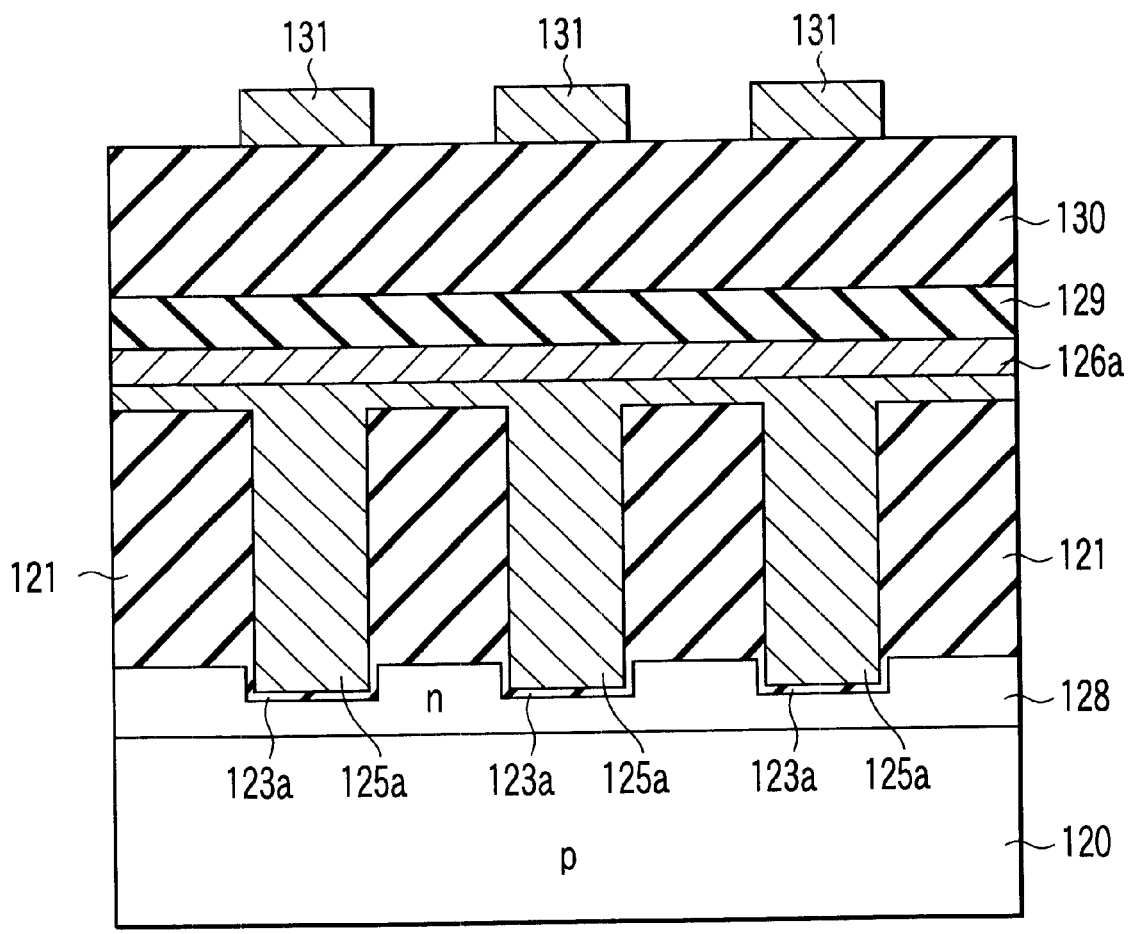
FIG. 31C is a cross sectional view of the DRAM cell array shown in FIG. 30 taken along the XXXIC—XXXIC line of the plan pattern view of FIG. 30.

The constitution of the memory cell array in which a plurality of MOS transistor described above are arranged in the matrix is shown in FIGS. 30 and 31A to 31C. FIG. 30 is a plan view, and FIGS. 31A, 31B and 31C are XXXIA—XXXIA line, XXXIB—XXXIB line and XXXIC—XXXIC line cross sectional views of FIG. 30, respectively.

The bit line 131 is connected to the n-type drain diffusion layers 127 via contact plugs 141 formed of polycrystal silicon embedded in bit line contact holes opened in the interlayer insulating film 130.

In the memory cell array, the trenches 123a, 123b are formed in opposite ends of the bit line direction of the rectangular element forming region, and two gate electrodes 125a, 125b are embedded in the trenches to constitute one MOS transistor. In this case, as shown in FIG. 30, when a line/space is formed with a minimum processing size F for the bit lines BL, word lines WL, and back word lines BWL, a unit DRAM cell has an area of $8F^2$ as shown by a broken line in FIG. 30.

In this memory cell array constitution, the word lines WL and back word lines BWL forming pairs are provided for a plurality of memory cells arranged along a bit line direction. Therefore, the bit line BL is driven in synchronization with the driving of the word line WL, and the potential of the channel region of each MOS transistor can be controlled to be optimum. That is, when the word line WL is set to a negative potential, and the "1" data is held, the negative potential is also applied to the back word line BWL forming a pair with the word line WL, and the held state of the "1" data can thereby satisfactorily be kept. When the potential of the word line WL is raised and the data is written, the potential of the back word line BWL is also raised, then a channel region potential can be raised by the capacity coupling, and the data can securely be written. During the writing of the "0" data, even when the channel is formed on the word line WL side, the channel region potential can be raised by the back word line BWL, and therefore the "0" data can securely be written. As described above, the "0" and "1" data can be stored with a large threshold voltage difference.

Moreover, the negative potential is applied to the unselected word line WL and the data is held. In this case, the back word line BWL forming a pair with the word line WL is also set to the negative potential, and the channel region potential is thereby controlled to be low. Therefore, when the "0" data is written in another memory cell along the same bit line, data destruction in the unselected cell with the "1" data held therein can securely be prevented.

In the present embodiment, one MOS transistor is formed in one element forming region defined by the element isolation insulating film. Alternatively, the gate electrodes connected to the back word lines BWL are shared in one element forming region defined by the element isolation insulating film so that two MOS transistors can be formed.

Ninth Embodiment

Figure 33A:
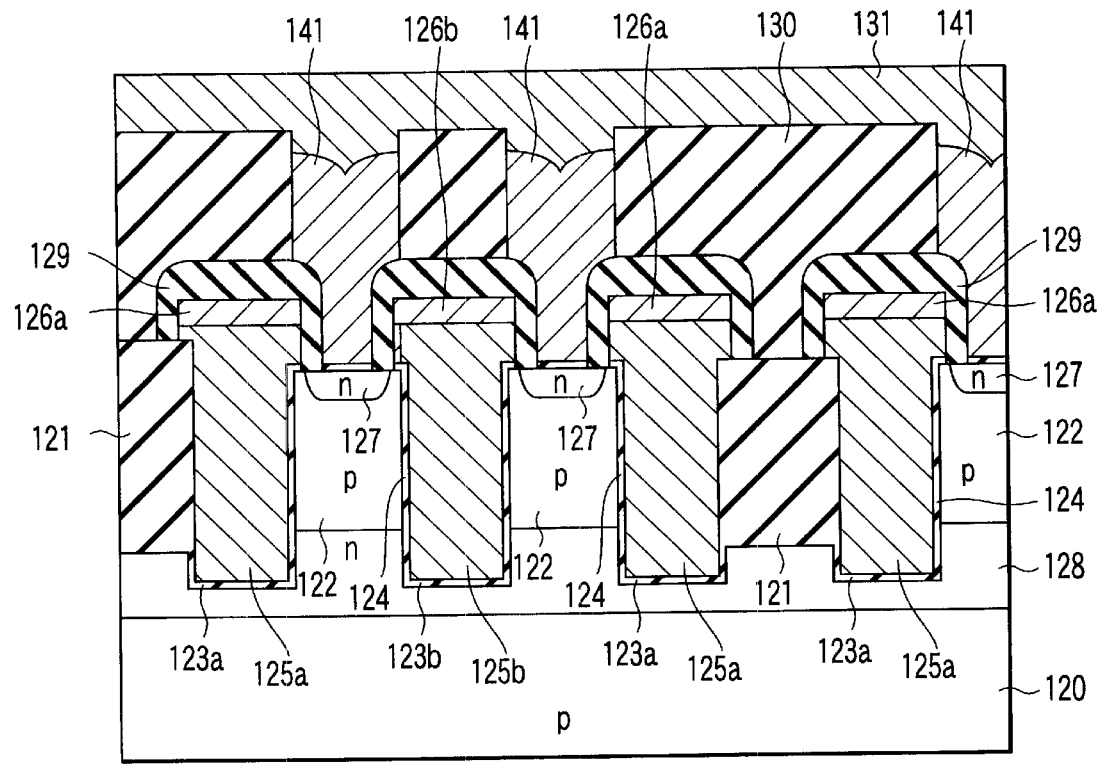
FIG. 33A is a cross sectional view of the DRAM cell array shown in FIG. 32 taken along the XXXIIIA—XXXIIIA line of the plan pattern view of FIG. 32.
Figure 33B:
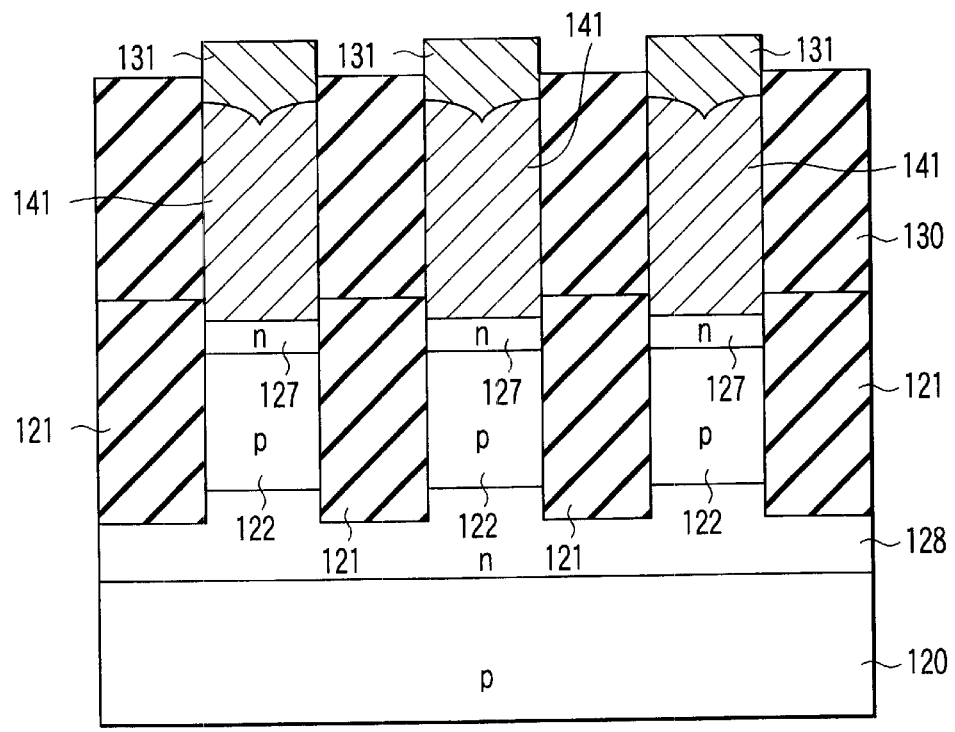
FIG. 33B is a cross sectional view of the DRAM cell array shown in FIG. 32 taken along the XXXIIIB—XXXIIIB line of the plan pattern view of FIG. 32.
Figure 33C:
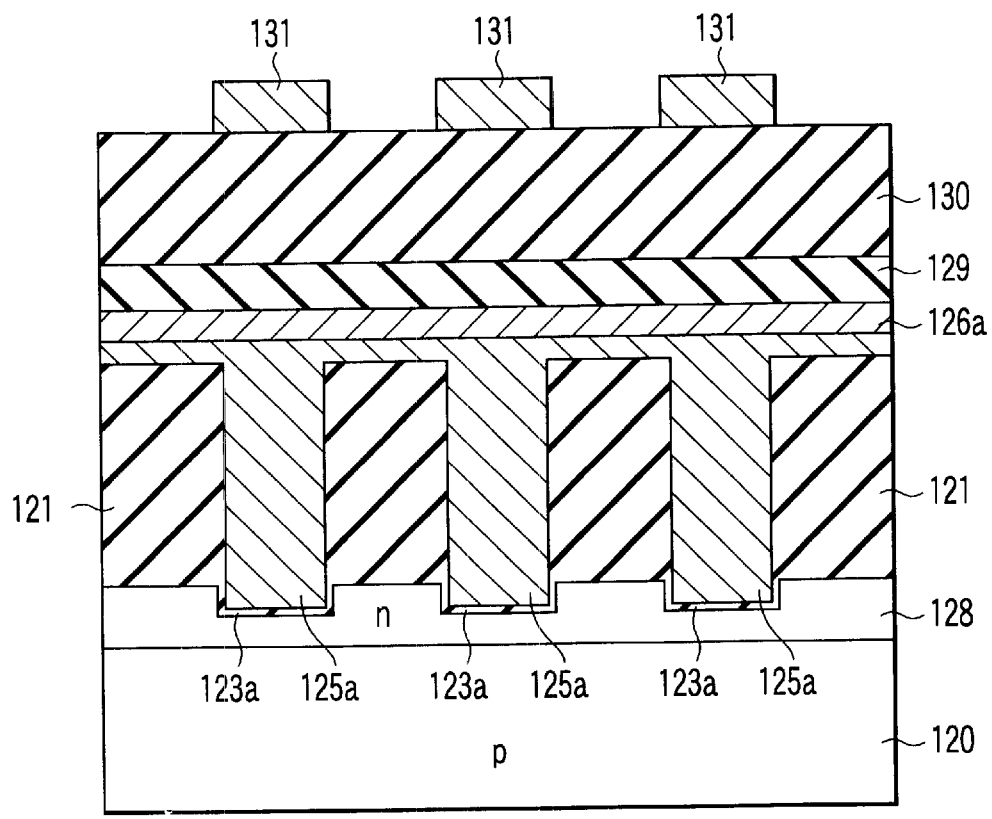
FIG. 33C is a cross sectional view of the DRAM cell array shown in FIG. 32 taken along the XXXIIIC—XXXIIIC line of the plan pattern view of FIG. 32.

The constitution of the memory cell array is shown in FIGS. 32 and 33A, 33B, 33C. FIG. 32 is a plan view, and FIGS. 33A, 33B and 33C are XXXIIIA—XXXIIIA line, XXXIIIB—XXXIIIB line, XXXIIIC—XXXIIIC line cross sectional view of FIG. 32.

In the present embodiment, the trenches 123a are formed in the opposite ends of the longitudinal direction (bit line direction) of the rectangular element forming region defined by the element isolation insulating film 121, and the trench 123b is also formed in a middle portion. The regions held among the three trenches 123a, 123b form two element bodies 122 of the MOS transistor. The gate electrode 125b shared by two MOS transistors is embedded in the trench 123b in the middle portion, and the respective gate electrodes 125a are embedded in the trenches 123a in the opposite ends. Moreover, the gate electrode 125b is connected to the back word line BWL common to two MOS transistors, and the gate electrodes 125a are connected to the respective independent word lines WL.

Other respects are the same as the foregoing embodiment, a part corresponding to that of the foregoing embodiment is denoted with the same reference numerals, and detailed description is omitted.

In the preset embodiment, since the shared back word line BWL is provided between the two word lines WL, the back word line BWL is driven in synchronization with the selected word line WL, and the data of the memory cell along the unselected word line is then damaged. Therefore, in the embodiment, the back word line BWL is set, for example, to a negative fixed potential and operated. Thereby, on the back word line BWL side of the channel region of the MOS transistor, majority carriers accumulated state (accumulation state) is held such that the reverse layer is not formed, and the potential of the channel region by the word line WL can be controlled.

Moreover, in this embodiment, as shown in FIG. 32, when the line/space is formed with the minimum processing size F for the bit lines BL, word lines WL, and back word lines BWL, the unit DRAM cell has an area of $6F^2$ as shown by a broken line in FIG. 32.

The manufacturing process of the memory cell array according to the present invention will next be described in terms of an example of the embodiment shown in FIGS. 32 and 33A–33C. FIGS. 34A, 34B to 40A, and 40B show the manufacturing process with the XXXIIIA—XXXIIIA section and XXXIIIB—XXXIIIB section of FIG. 32.

Figure 34A:
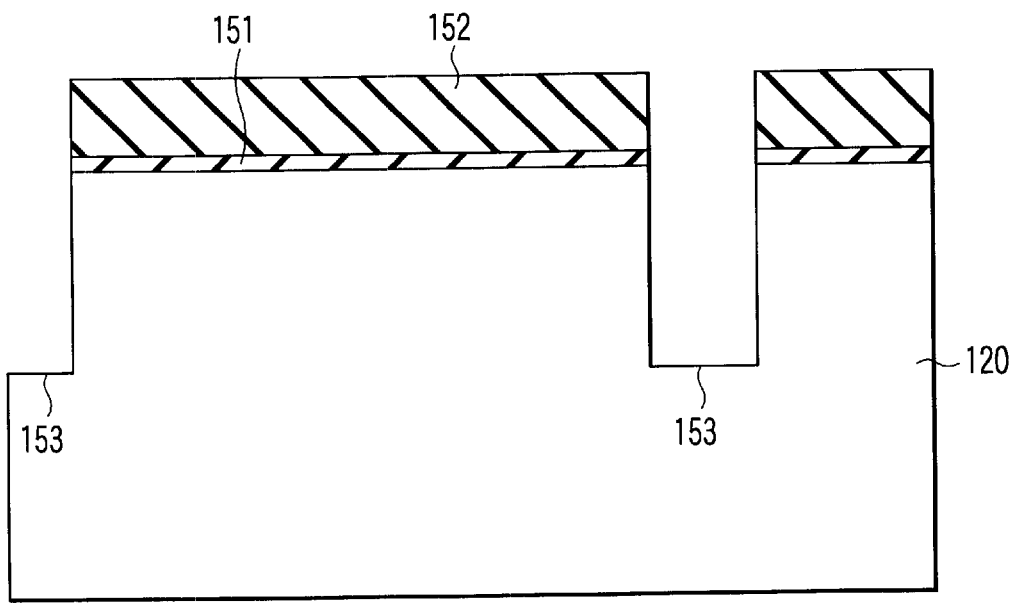
FIG. 34A is a cross sectional view of the DRAM cell array shown in FIG. 32 taken along the XXXIIIA—XXXIIIA line of the plan pattern view of FIG. 32, when an element separation groove is formed.
Figure 34B:
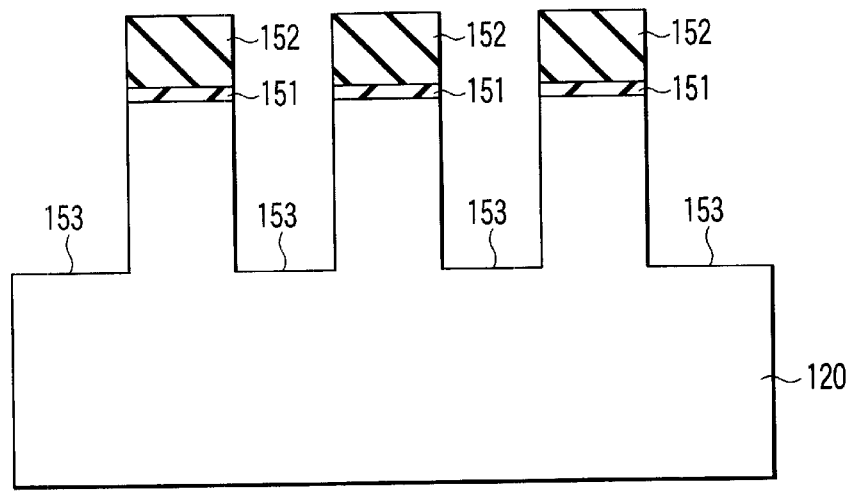
FIG. 34B is a cross sectional view of the DRAM cell array shown in FIG. 32 taken along the XXXIIIB—XXXIIIB line of the plan pattern view of FIG. 32, when the element separation groove is formed.

As shown in FIGS. 34A and 34B, a buffer oxide film 151 and silicon nitride film 152 are deposited on the p-type silicon substrate 120, and patterned by a lithography step and RIE step to form a mask with which the element forming region is formed. This mask is used to etch the silicon substrate 120 by RIE, and element isolation trenches 153 are formed to define rectangular element forming regions.

Figure 35A:
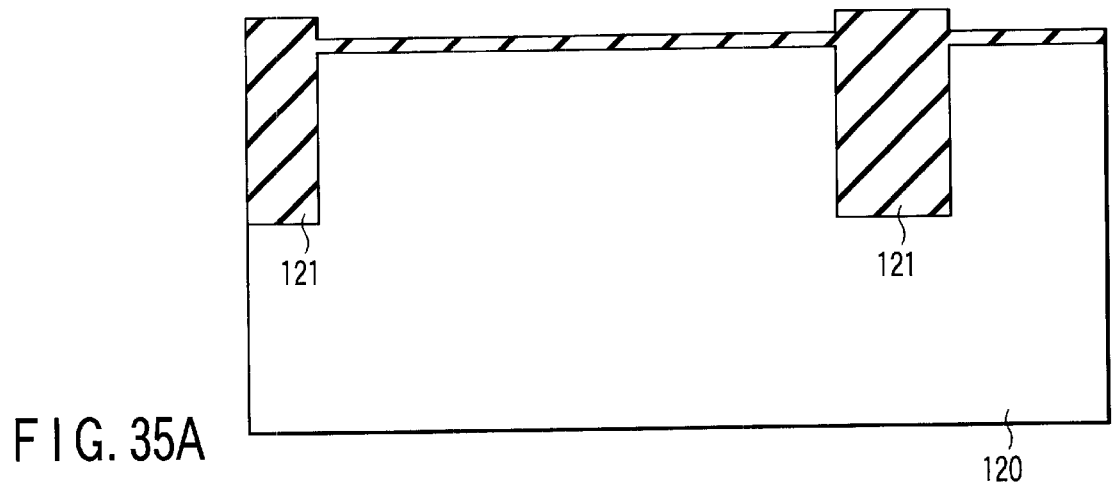
FIG. 35A is a cross sectional view of the DRAM cell array shown in FIG. 32 taken along the XXXIIIA—XXXIIIA line of the plan pattern view of FIG. 32, when an element separating insulation film is embedded in the element separation groove.
Figure 35B:
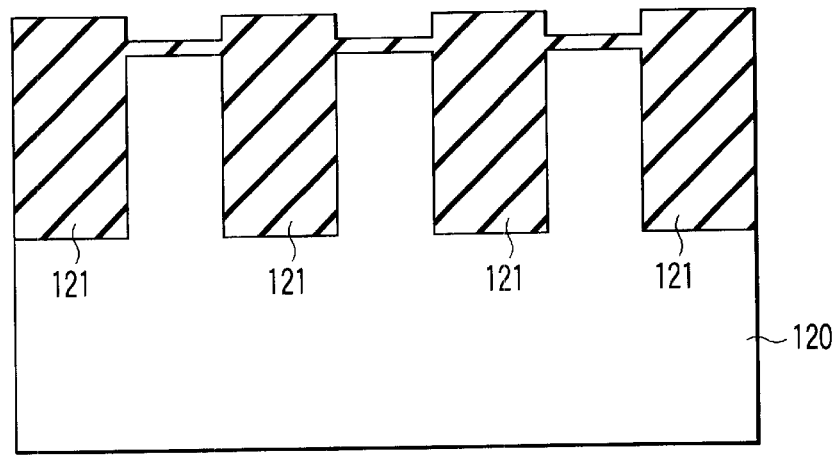
FIG. 35B is a cross sectional view of the DRAM cell array shown in FIG. 32 taken along the XXXIIIB—XXXIIIB line of the plan pattern view of FIG. 32, when the element separating insulation film is embedded in the element separation groove.

Subsequently, as shown in FIGS. 35A and 35B, the element isolation insulating films 121 such as the silicon oxide film are embedded in the element isolation trenches 153. Subsequently, the ions are implanted with a high acceleration energy, and as shown in FIGS. 36A and 36B, the n-type source diffusion layer 128 is formed to pass under the element isolation insulating films 121 and to be continuous in the whole cell array region. Moreover, in the region forming the channel region in the upper portion of the source diffusion layer 128, the ions are implanted to control the threshold value if necessary.

Figure 37A:
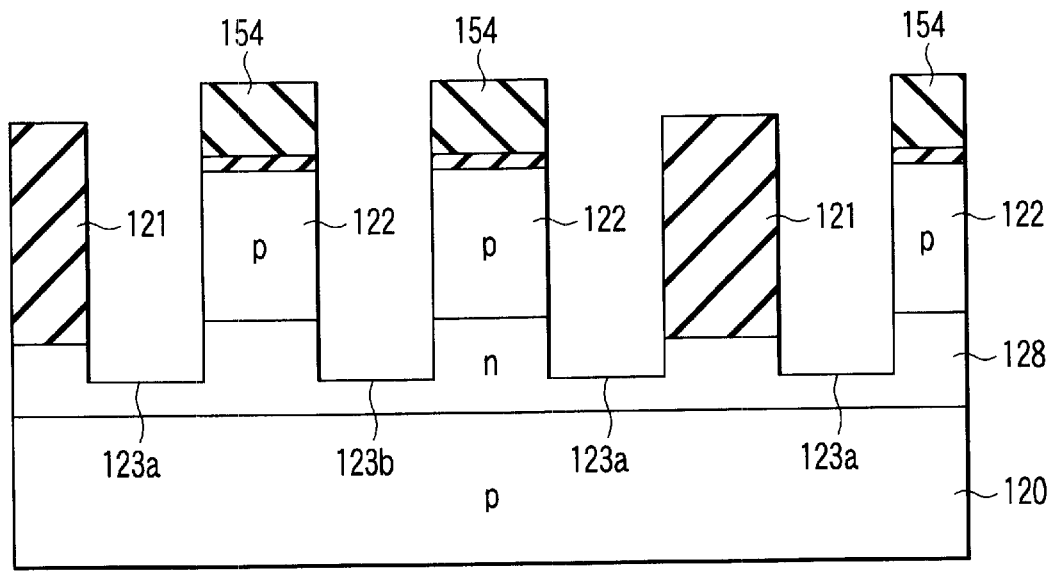
FIG. 37A is a cross sectional view of the DRAM cell array shown in FIG. 32 taken along the XXXIIIA—XXXIIIA line of the plan pattern view of FIG. 32, when a trench in which a gate is to be embedded is formed.
Figure 37B:
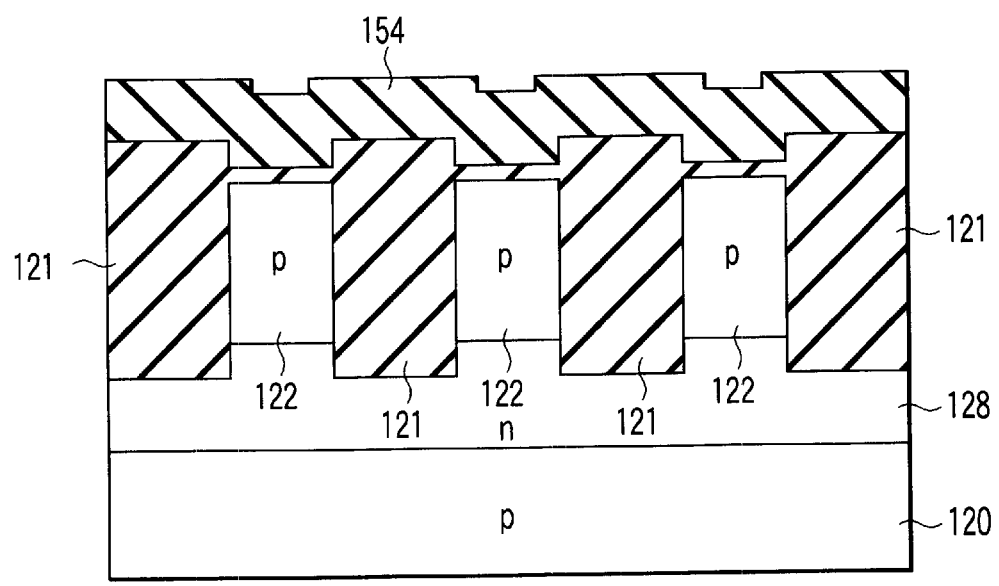
FIG. 37B is a cross sectional view of the DRAM cell array shown in FIG. 32 taken along the XXXIIIB—XXXIIIB line of the plan pattern view of FIG. 32, when the trench in which the gate is to be embedded is formed.

Subsequently, as shown in FIGS. 37A and 37B, the mask is formed by a silicon nitride film 154, the silicon substrate 120 is etched by the RIE, and the trenches 123a, 123b are formed in the opposite ends and middle portion of one element forming region. Each depth of the trenches 123a, 123b is a depth which reaches at least the source diffusion layer 128. As shown in FIG. 37A, the trenches 123a, 123b are deeper than the bottom surfaces of the element isolation insulating films 121, and are deep within the source diffusion layer 128. Thereby, two rectangular element bodies 122 are formed in one element forming region. The opposite surfaces of the element channel region 122 in a word line WL direction contact the element isolation insulating films 121 as shown in FIG. 37B, and the side surfaces thereof in a bit line BL direction are exposed to the trenches 123a, 123b as shown in FIG. 37A.

Figure 38A:
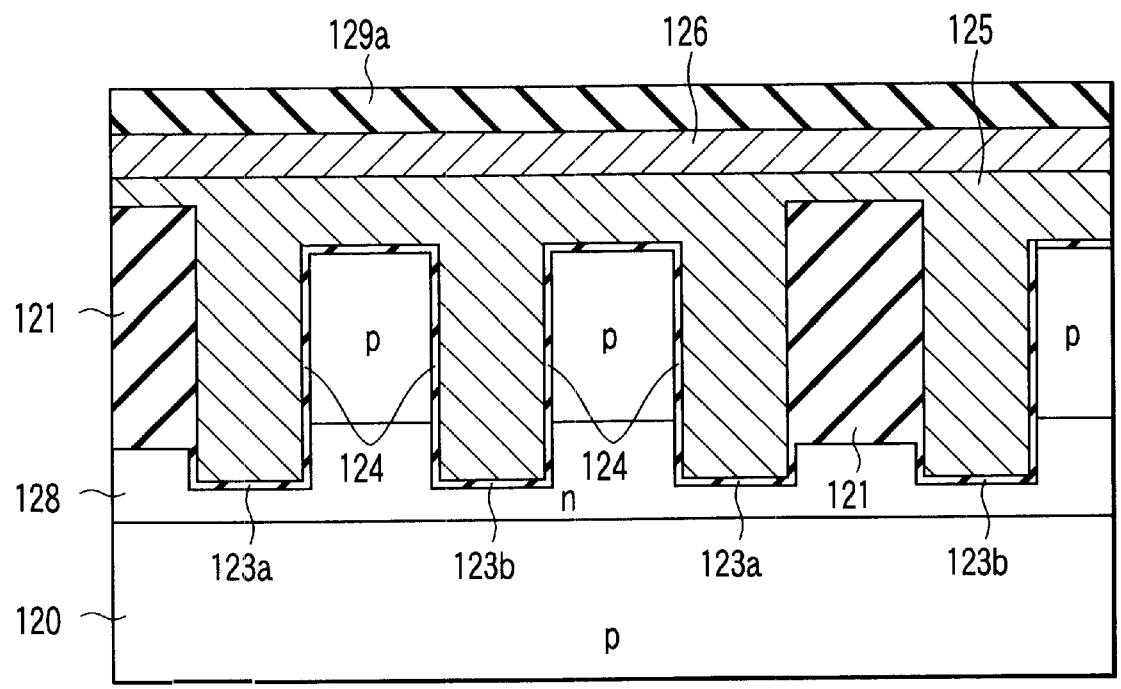
FIG. 38A is a cross sectional view of the DRAM cell array shown in FIG. 32 taken along the XXXIIIA—XXXIIIA line of the plan pattern view of FIG. 32, when a gate is embedded in the gate embedding trench.
Figure 38B:
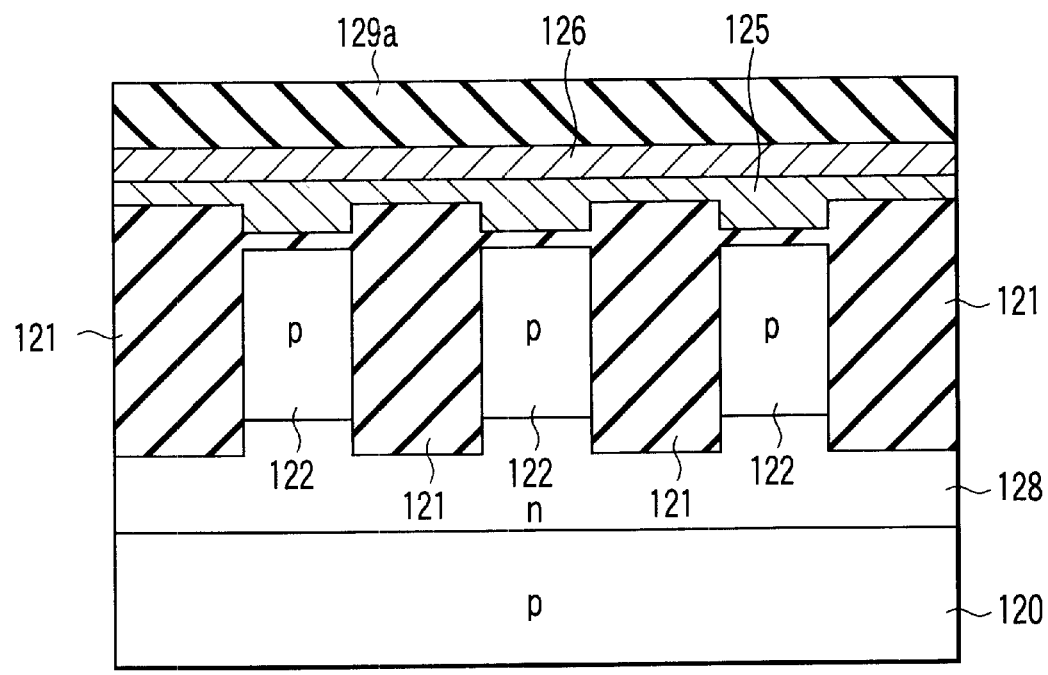
FIG. 38B is a cross sectional view of the DRAM cell array shown in FIG. 32 taken along the XXXIIIB—XXXIIIB line of the plan pattern view of FIG. 32, when the gate is embedded in the gate embedding trench.
Figure 39A:
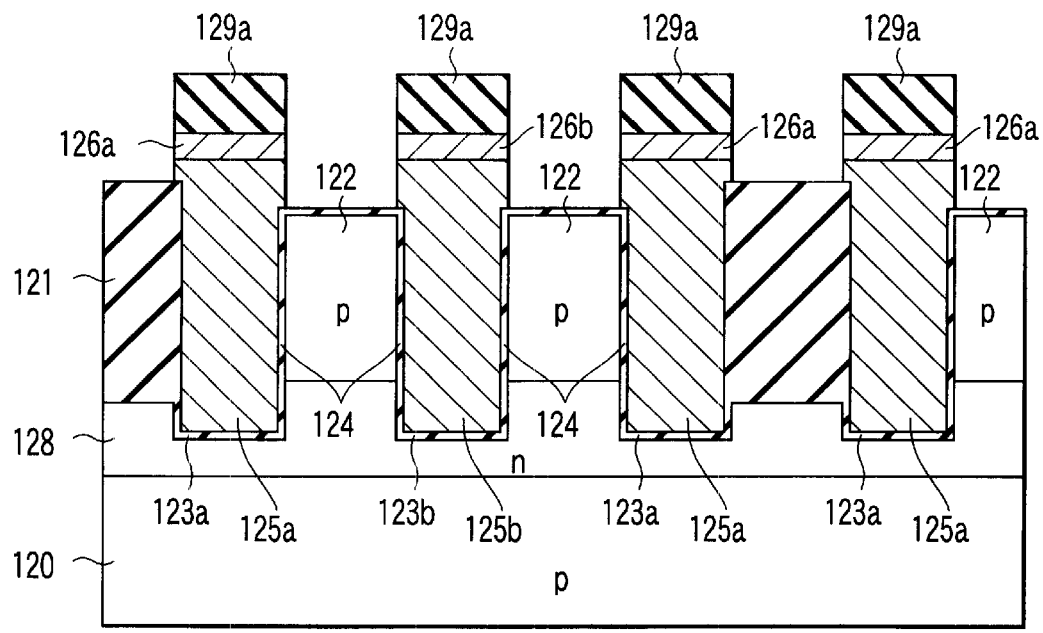
FIG. 39A is a cross sectional view of the DRAM cell array shown in FIG. 32 taken along the XXXIIIA—XXXIIIA line of the plan pattern view of FIG. 32, when a word line pattern and a back word line pattern are formed.
Figure 39B:
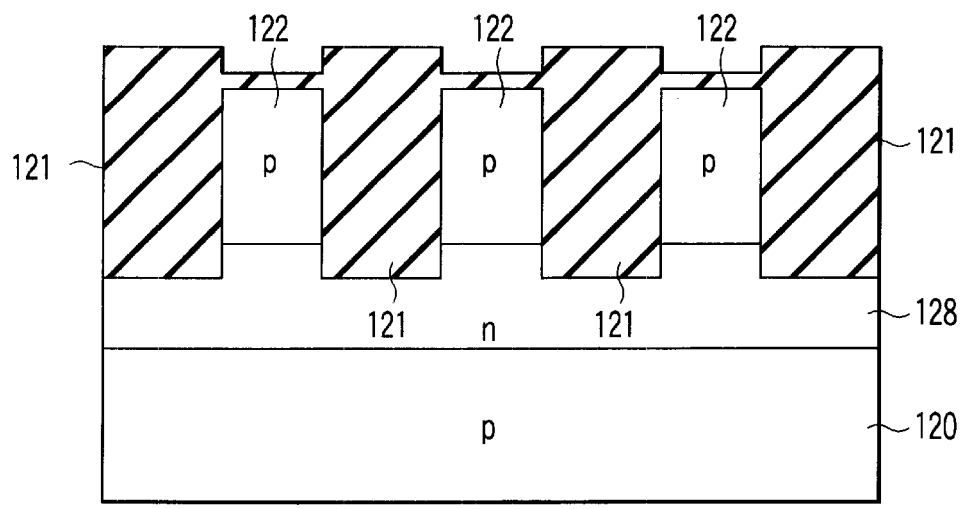
FIG. 39B is a cross sectional view of the DRAM cell array shown in FIG. 32 taken along the XXXIIIB—XXXIIIB line of the plan pattern view of FIG. 32, when the word line pattern and the back word line pattern are formed.

Additionally, the silicon nitride film 154 is removed, and as shown in FIGS. 38A and 38B, the gate insulating films 124 are formed on the side surfaces of the element bodies 122 exposed to the trenches 123a, 123b. Subsequently, the polycrystal silicon film 125 forming the gate electrode is embedded in the trenches 123a, 123b and deposited to be flat, further the metal wiring layer 126 such as WSI is deposited, and a silicon nitride film 129a is deposited on the wiring layer. Subsequently, these silicon nitride film 129a, metal wiring layer 126 and polycrystal silicon film 125 are patterned. As shown in FIGS. 30A and 39B, the polycrystal silicon gate electrodes 125a, 125b embedded in the respective trenches 123a, 123b, and metal wirings 126a, 126b for connecting the electrodes in common as the word line WL and back word line BWL are formed.

Figure 40A:
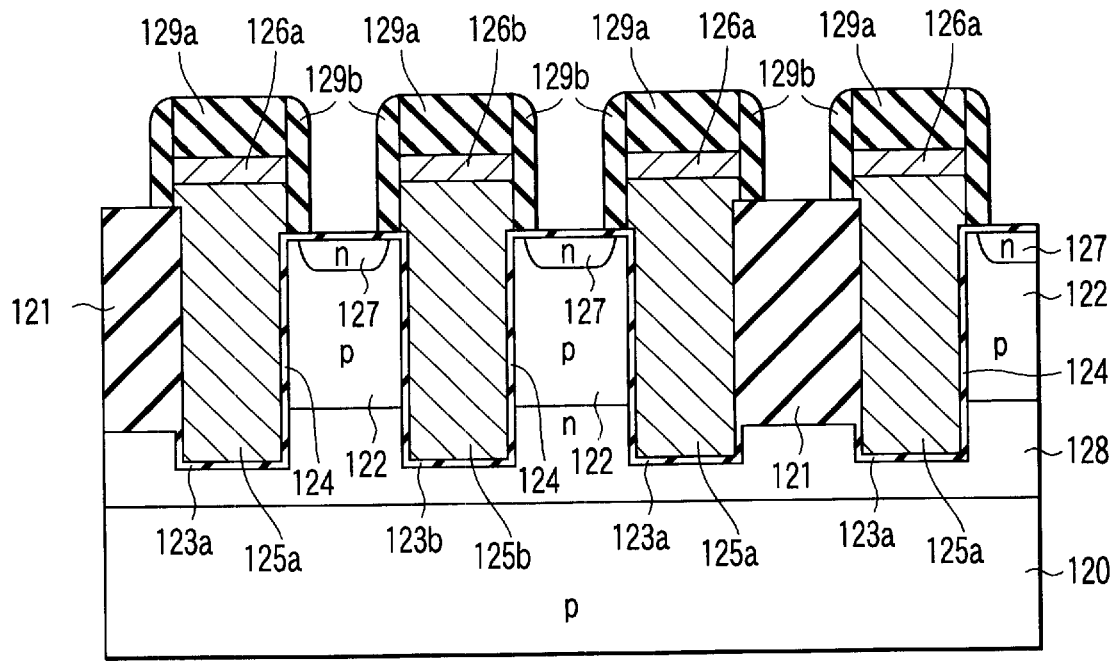
FIG. 40A is a cross sectional view of the DRAM cell array shown in FIG. 32 taken along the XXXIIIA—XXXIIIA line of the plan pattern view of FIG. 32, when insulation films are formed on the side surface of the word line pattern and the side surface of the back word line pattern and a drain diffusion layer is formed.
Figure 40B:
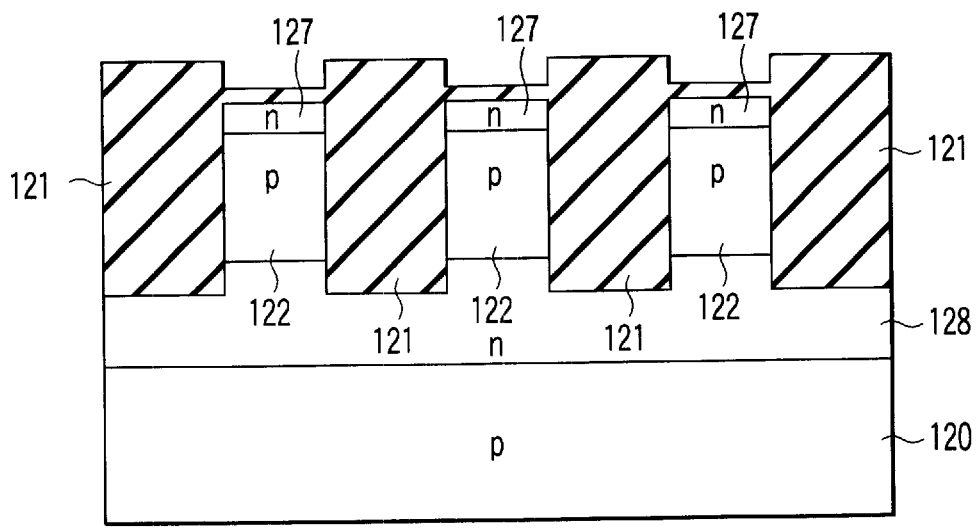
FIG. 40B is a cross sectional view of the DRAM cell array shown in FIG. 32 taken along the XXXIIIB—XXXIIIB line of the plan pattern view of FIG. 32, when insulation films are formed on the side surface of the word line pattern and the side surface of the back word line pattern and the drain diffusion layer is formed.

Subsequently, as shown in FIGS. 40A and 40B, a silicon nitride film 129b is deposited, etched by the RIE, and left on the side walls of the word line WL and back word line BWL. Moreover, the ions are implanted, and the n-type drain diffusion layer 127 is formed on the surface of each element channel region 122.

Thereafter, as not shown in the manufacturing process diagram, however as shown in FIGS. 33A–33C, the interlayer insulating film 130 is deposited, the bit line contact hole is formed, the polycrystal silicon plugs 141 are filled in, and the bit line 131 is formed. In this way, the semiconductor device as shown in FIG. 32 and FIGS. 33A to 33C is manufactured.

With reference to FIGS. 34A, 34B to 40A, 40B, a manufacturing process of the cell array has been described above in which the back word line BWL is shared by adjacent cells (FIG. 32 and FIGS. 33A to 33C), however the similar manufacturing process can also be applied to a system in which the back word line BWL is provided for each cell as shown in FIGS. 30 and 31A to 31C.

In the above-described embodiments shown in FIG. 30 and FIGS. 31A to 31C and FIG. 32 and FIGS. 33A to 33C, the trenches 123a, 123b for embedding the gate electrodes have the same width as that of the element channel region 122 held between the trenches. However, if miniaturization is further advanced, a sufficient width of the element channel region 122 cannot possibly be secured. Moreover, when the periphery of the word line WR-L and back word line BWL is coated with the silicon nitride film 129, bit line contacts are self-aligned and formed in the word line WL and back word line BWL. However, there is misalignment in the lithography process of the word line WL and back word line BWL, the positions of the bit line contacts deviate, and this also causes a short-circuit trouble between the bit line 31 and the gate electrodes 125a, 125b.

Tenth Embodiment

To solve the problem, it is effective to set the widths of the trenches 123a, 123b to be smaller than the width of the element channel region 122. For example, with respect to the section of FIG. 31A, a section in which a width W1 of the trench 123a or 123b in the bit line BL direction is reduced is shown in FIG. 41. Thereby, a width W2 of the element channel region 122 can be secured to be sufficiently larger than the width W1 of the trench 123a or 123b. Moreover, the short-circuit trouble of the bit line 131 with the gate electrodes 125a, 125b can be prevented from being caused by the alignment deviation.

Eleventh Embodiment

The similar structure is also effective, when the back word line BWL is shared by the adjacent cells. The structure is shown in FIG. 42 which corresponds to the section of FIG. 33A. The width W2 of the element channel region 122 is secured to be sufficiently larger than the width W1 of the trench 123a or 123b.

Twelfth Embodiment

Figure 43:
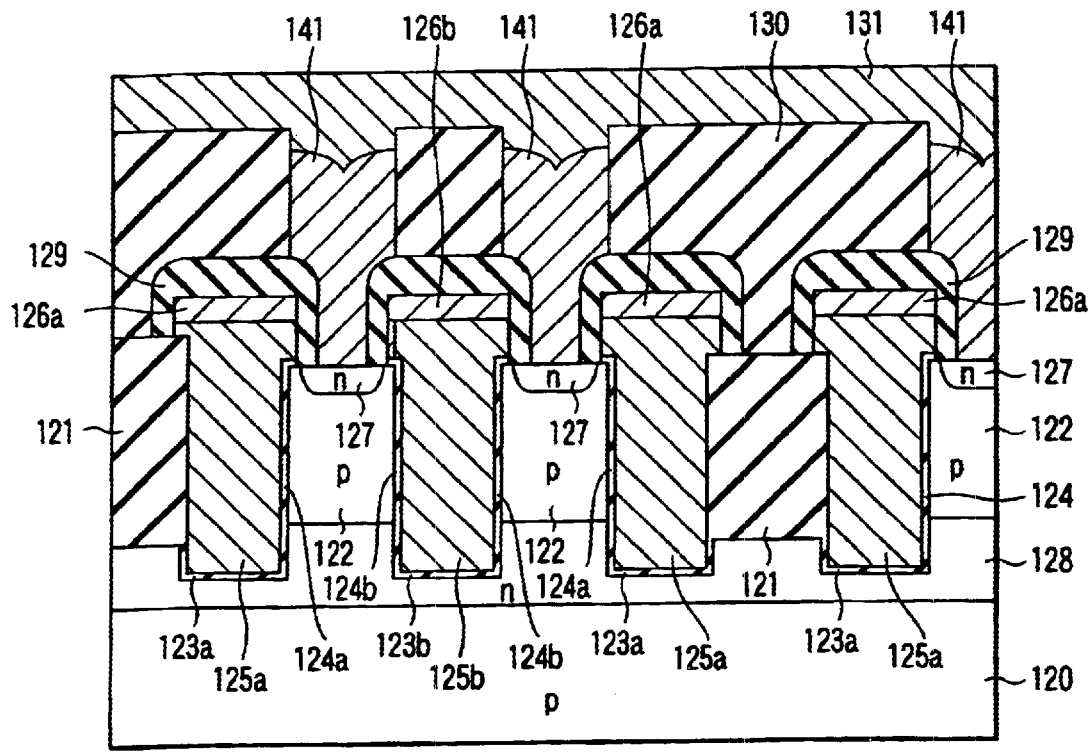
FIG. 43 is a cross sectional view of a DRAM cell array according to a twelfth embodiment of the present invention and the cross sectional view corresponds to that of FIG. 33A.
Figure 44:
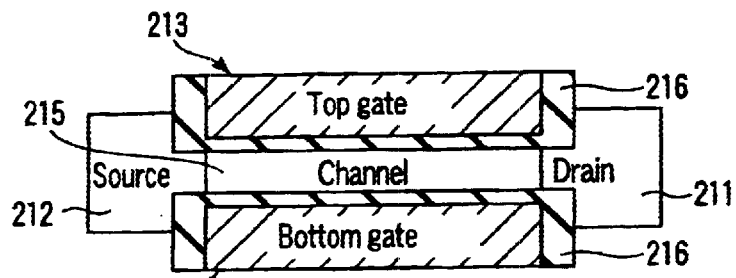
FIG. 44 is a cross sectional view of an example of a conventional double gate type device structure.
Figure 45:
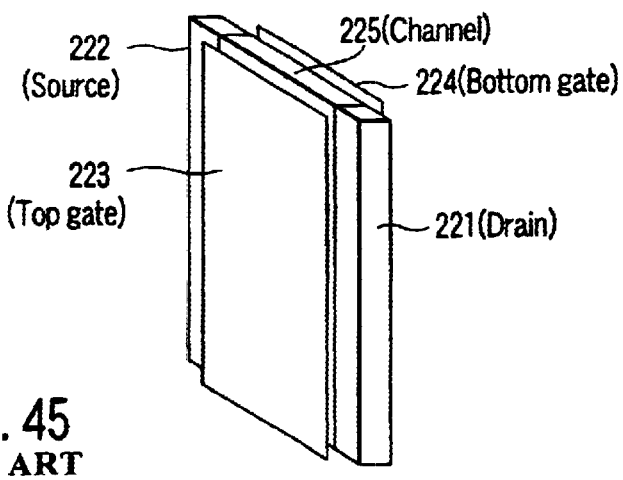
FIG. 45 is a cross sectional view of another example of a conventional double gate type device structure.

In the above-described embodiments shown in FIG. 30 and FIGS. 31A to 31C and FIG. 32 and FIGS. 33A to 33C, the gate insulating films 124 on the word line WL side and back word line BWL side have the same film thickness, however when the gate insulating films are separately formed, each film thickness can be set to be optimum. For example, with respect to FIG. 33A, FIG. 43 shows an example in which a gate insulating film 124b on the back word line BWL side is formed to be thicker than a gate insulating film 124a on the word line WL side. The gate insulating film 124b on the back word line BWL side is selected so as to optimize the size of capacity coupling with respect to the channel region.

The present invention is not limited to the above-described embodiments. For example, in the embodiments, the n-channel MOS transistor is used, however a p-channel MOS transistor may be used to constitute the similar DRAM.

Moreover, in the embodiments, the source diffusion layer is formed by implanting the ions. However, for example, when an epitaxial substrate, for example, with a p-type epitaxial growth layer formed on the n-type diffusion layer is used, the ion implanting step of the source diffusion layer becomes unnecessary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   drain and source regions of a MOS transistor formed in a surface of the semiconductor substrate;
   a gate electrode formed on a surface of a channel region of the MOS transistor between said drain and source regions of said semiconductor substrate with a gate insulating film between the gate electrode and the channel region;
   trench type element isolation regions in each of which an insulating film is formed on a surface of a trench formed in the surface of said semiconductor substrate, the element isolation regions sandwiching the channel region from opposite sides thereof in a channel width direction, and
   a conductive material layer for a back gate electrode, which is embedded in a trench of at least one of said element isolation regions, configured to be supplied with a predetermined voltage to make an depletion layer in a region of the semiconductor substrate under the channel region of said MOS transistor or to voltage-control the semiconductor substrate region.

2. The semiconductor device according to claim 1, further comprising an upper wiring layer which is formed to contact an upper portion of said conductive material layer.

3. The semiconductor device according to claim 2, wherein the upper wiring layer extends onto a peripheral region of the MOS transistor.

4. The semiconductor memory device according to claim 1, wherein said MOS transistor dynamically stores a first data state in which the channel region is set to a first potential and a second data state in which the channel region is set to a second potential, and said first data state is written when an impact-ionization is generated in the vicinity of a drain-channel junction of the MOS transistor, and the second data state is written when a forward bias is applied to the drain-channel junction with a predetermined potential applied thereto by capacity coupling of said gate electrode.

5. The semiconductor device according to claim 1, wherein the insulating film formed on the surface of said trench type element isolation region is thicker than said gate insulating film.

6. A semiconductor device comprising: an SOI semiconductor substrate in which a silicon layer is formed on an insulating film formed on a supporting semiconductor substrate;
   drain and source regions of a MOS transistor formed in a surface of the SOI semiconductor substrate;
   a gate electrode formed on a surface of a channel region of the MOS transistor between said drain and source regions of said semiconductor substrate with a gate insulating film between the gate electrode and the channel region;
   trench type element isolation regions in each of which an insulating film is formed on a surface of a trench formed in the surface of said semiconductor substrate;
   a conductive material layer for a back gate electrode, which is embedded in a trench of at least one of said element isolation regions, configured to be supplied with a predetermined voltage to make an depletion layer in a region of the semiconductor substrate under the channel region of said MOS transistor;
   a well region formed in a surface of the supporting semiconductor substrate of said SOI semiconductor substrate, a lower end of said conductive material layer being connected to said well region, and
   the upper portion of said conductive material layer being covered with the insulating film formed on the surface of said element isolation region.

7. The semiconductor device according to claim 6, further comprising an upper wiring layer which is formed to contact an upper portion of said conductive material layer.

8. The semiconductor device according to claim 7, wherein the upper wiring layer extends onto a peripheral region of the MOS transistor.

9. The semiconductor memory device according to claim 6, wherein said MOS transistor dynamically stores a first data state in which the channel region is set to a first potential and a second data state in which the channel region is set to a second potential, and said first data state is written when an impact-ionization is generated in the vicinity of a drain-channel junction of the MOS transistor, and the second data state is written when a forward bias is applied to the drain-channel junction with a predetermined potential applied thereto by capacity coupling of said gate electrode.

10. A semiconductor device comprising:
   a memory cell array including an arrangement of MOS transistors for memory cells formed on a semiconductor substrate;
   a peripheral circuit region formed on said semiconductor substrate;
   a plurality of trench type element isolation regions formed in the memory cell array and the peripheral circuit region, the element isolation regions having trenches formed in a surface of said semiconductor substrate, and
   a conductive material layer for a back gate electrode, which is embedded in the trench at least one of the element isolation regions, configured to be supplied with a predetermined voltage to make an depletion layer in a region of the semiconductor substrate under a channel region of the MOS transistor or to voltage-control the semiconductor substrate region.

11. A semiconductor device according to claim 10, wherein said plurality of trench type element isolation regions sandwiches the channel region between said drain and source regions from opposite sides of a channel width direction, and said conductive material layer is embedded in the trench of at least one of the element isolation regions formed on the opposite sides of said channel regions in the channel width direction.

12. The semiconductor device according to claim 10, wherein said conductive material layer is embedded only in the trenches of the element isolation regions formed in said memory cell array.

13. The semiconductor device according to claim 10, further comprising an upper wiring layer which is formed to contact an upper portion of said conductive material layer via a contact.

14. The semiconductor device according to claim 10, wherein said semiconductor substrate is an SOI semiconductor substrate in which a silicon layer is formed on an insulating film formed on a supporting semiconductor substrate.

15. The semiconductor device according to claim 10, wherein said semiconductor substrate is an SOI semiconductor substrate in which a silicon layer is formed on an insulating film formed on a supporting semiconductor substrate, a well region is formed in the surface of the supporting semiconductor substrate of said SOI semiconductor substrate, a lower end of said conductive material layer is connected to said well region, and an upper portion of said conductive material layer is covered with the insulating film formed on the surface of said element isolation region.

16. The semiconductor device according to claim 15, wherein a contact leading to said well region is formed in a contact region around said memory cell array.

17. The semiconductor memory device according to claim 10, wherein each of said MOS transistors dynamically stores a first data state in which the channel region is set to a first potential and a second data state in which the channel region is set to a second potential, and said first data state is written when an impact-ionization is generated in the vicinity of a drain-channel junction of said each MOS transistor, and the second data state is written when a forward bias is applied between the drain-channel junction with a predetermined potential applied thereto by capacity coupling of said gate electrode of said each MOS transistor.

18. A semiconductor memory device comprising a vertical MOS transistor including:
   a semiconductor substrate;
   a first conductive type element region defined in the semiconductor substrate, the element region constituting a channel region;
   first and second gate electrodes embedded in first and second trenches formed to sandwich the element region, the first and second gate electrodes opposing to side surfaces of the element region;
   first and second gate insulation films provided between the first gate electrode and the element region and the second gate electrode and the element region, respectively;
   a second conductive type drain diffusion layer formed on a surface of said element region; and
   a second conductive type source diffusion layer embedded in semiconductor substrate in a predetermined depth.

19. The semiconductor memory device according to claim 18, wherein a plurality of said MOS transistor are defined by element isolation insulating films and arranged in a matrix, the source diffusion layer is common to the MOS transistor arranged in the matrix, the drain diffusion layers of the MOS transistor arranged in a first direction are connected to a bit line, the first gate electrodes of the MOS transistor arranged in a second direction intersecting the first direction are connected to a word line, and the second gate electrodes of the MOS transistor arranged in the second direction are connected to a back word line.

20. The semiconductor memory device according to claim 19, wherein said back word line is driven in synchronization with the word line to control a potential of the element region.

21. The semiconductor memory device according to claim 19, wherein in a bit line direction, first and second trenches are formed at opposite ends of each of the element forming region and a third trench is formed at a middle portion thereof to separate the element forming region in the bit line direction, the first and second gate electrodes are embedded in the first and second trenches, respectively, a third gate electrode is embedded in the third trench, and the third gate electrode constitutes a common gate electrode of the is separated element forming regions.

22. The semiconductor memory device according to claim 21, wherein said back word line connected to the third gate electrode constitutes a common back word line of the separated element forming regions in the bit line direction, and a fixed potential is applied to the third gate electrode so that side surfaces of the third gate electrode are kept in majority carrier accumulated state.

23. The semiconductor memory device according to claim 18, wherein the first and second trenches are formed at opposite ends of the element region in a bit line direction, and the first and second gate electrodes are embedded in the trenches.

24. The semiconductor memory device according to claim 18, wherein said element region of the MOS transistor is electrically floating.

25. The semiconductor memory device according to claim 18, wherein said MOS transistor dynamically stores a first data state in which the element region is set to a first potential and a second data state in which the element region is set to a second potential.

26. The semiconductor memory device according to claim 25, wherein said first data state is written when an impact-ionization is generated in the vicinity of a drain-channel junction, and the second data state is written when a forward bias is applied to the drain-channel junction with a predetermined potential applied thereto by capacity coupling of said first gate electrode.

27. A manufacturing method of a semiconductor memory device, comprising:

forming an element forming region defined by an element isolation insulating film in a semiconductor substrate;

ion-implanting impurities in said semiconductor substrate;

forming a source diffusion layer adjacent to a bottom of said element forming region;

forming at least two trenches at a predetermined distance in said element forming region;

forming gate insulating films on side surfaces of an element channel region sandwiched by said two trenches;

embedding first and second gate electrodes in said trenches; and forming a drain diffusion layer on the surface of said element channel region.

28. The manufacturing method of the semiconductor memory device according to claim 27, further comprising:

forming two trenches in opposite ends of said element forming region in a longitudinal direction, and embedding the first and second gate electrodes in the trenches.

29. The manufacturing method of the semiconductor memory device according to claim 27, further comprising:

forming three trenches in opposite ends and a middle portion of the element forming region in a longitudinal direction to separate the element forming region;

embedding a third gate electrode in the trench of the middle portion, the third gate electrode constituting a common gate electrode to the separated element forming regions.

* * * * *